United States Patent
Brunet

(10) Patent No.: US 10,506,347 B2
(45) Date of Patent: Dec. 10, 2019

(54) NONLINEAR CONTROL OF VENTED BOX OR PASSIVE RADIATOR LOUDSPEAKER SYSTEMS

(71) Applicant: Samsung Electronics Co., Ltd., Suwon-si, Gyeonggi-do (KR)

(72) Inventor: Pascal M. Brunet, Pasadena, CA (US)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 67 days.

(21) Appl. No.: 15/873,530

(22) Filed: Jan. 17, 2018

(65) Prior Publication Data

US 2019/0222939 A1    Jul. 18, 2019

(51) Int. Cl.
*H04R 9/06* (2006.01)
*H03G 3/00* (2006.01)
(Continued)

(52) U.S. Cl.
CPC ............ *H04R 9/06* (2013.01); *H03G 3/004* (2013.01); *H04R 1/02* (2013.01); *H04R 9/045* (2013.01)

(58) Field of Classification Search
CPC ......... H04R 9/06; H04R 9/045; H04R 9/043; H04R 1/02; H04R 1/021; H04R 1/025; H04R 3/08; H04R 3/007; H04R 29/001
See application file for complete search history.

(56) References Cited

U.S. PATENT DOCUMENTS

| | | |
|---|---|---|
| 5,600,718 A | 2/1997 | Dent et al. |
| 5,870,484 A | 2/1999 | Greenberger et al. |

(Continued)

FOREIGN PATENT DOCUMENTS

| | | |
|---|---|---|
| EP | 0548836 B1 | 11/1997 |
| EP | 1799013 B1 | 2/2010 |

(Continued)

OTHER PUBLICATIONS

Salvatti, A. et al., "Maximizing performance from loudspeaker ports," Journal of the Audio Engineering Society, Jan./Feb. 2002, pp. 19-45, v. 50, No. 1/2, United States.

(Continued)

*Primary Examiner* — Fan S Tsang
*Assistant Examiner* — Angelica M McKinney
(74) *Attorney, Agent, or Firm* — Sherman IP LLP; Kenneth L. Sherman; Hemavathy Perumal

(57) ABSTRACT

One embodiment provides a vented box loudspeaker system comprising a speaker driver and a controller configured to receive a source signal for reproduction via the driver, determine a target displacement of the driver and a target sound pressure based on a first physical model of the system, and generate a control voltage based on the target displacement, the target sound pressure, and a second physical model of the system. Another embodiment provides a passive radiator loudspeaker system comprising an active speaker driver and a controller configured to receive a source signal for reproduction via the driver, determine a target displacement of a component based on a first physical model of the system, and generate a control voltage based on the target displacement and a second physical model of the system. In both embodiments, an actual displacement of the driver during the reproduction is controlled based on the generated control voltage.

20 Claims, 14 Drawing Sheets

(51) Int. Cl.
*H04R 9/04* (2006.01)
*H04R 1/02* (2006.01)

(56) References Cited

U.S. PATENT DOCUMENTS

| | | | |
|---|---|---|---|
| 6,059,926 | A | 5/2000 | Hiroshima |
| 6,275,592 | B1 | 8/2001 | Vartiainen |
| 7,024,014 | B1 | 4/2006 | Noll |
| 7,348,908 | B2 | 3/2008 | Slavin |
| 7,359,519 | B2 | 4/2008 | Lee et al. |
| 7,372,966 | B2 | 5/2008 | Bright |
| 7,467,071 | B2 | 12/2008 | Manrique et al. |
| 7,477,751 | B2 | 1/2009 | Lyon et al. |
| 7,688,984 | B2 | 3/2010 | De Callafon |
| 8,073,149 | B2 | 12/2011 | Kuze |
| 8,086,956 | B2 | 12/2011 | Su et al. |
| 8,130,994 | B2 | 3/2012 | Button et al. |
| 8,146,989 | B2 | 4/2012 | Godiska et al. |
| 8,204,210 | B2 | 6/2012 | van de Laar et al. |
| 8,391,498 | B2 | 3/2013 | Potard |
| 8,538,040 | B2 | 9/2013 | Kirn |
| 8,855,322 | B2 | 10/2014 | Ryu et al. |
| 8,938,084 | B2 | 1/2015 | Arai |
| 9,042,561 | B2 | 5/2015 | Gautama et al. |
| 9,130,527 | B2 | 9/2015 | Potard |
| 9,154,101 | B2 | 10/2015 | Dhuyvetter |
| 9,432,771 | B2 | 8/2016 | Oyetunji et al. |
| 9,553,554 | B2 | 1/2017 | Kimura et al. |
| 9,578,416 | B2 | 2/2017 | Gautama et al. |
| 9,635,454 | B2 | 4/2017 | Larrien |
| 9,661,428 | B2 | 5/2017 | Holladay et al. |
| 9,837,971 | B2 | 12/2017 | Luo et al. |
| 9,883,305 | B2 | 1/2018 | Risberg et al. |
| 9,900,690 | B2 | 2/2018 | Risberg et al. |
| 9,967,652 | B2 | 5/2018 | Baird et al. |
| 9,980,068 | B2 * | 5/2018 | Berthelsen ........... H04R 29/001 |
| 9,992,571 | B2 | 6/2018 | Hu |
| 10,219,090 | B2 * | 2/2019 | Adams ................... H04R 3/007 |
| 2002/0141098 | A1 | 10/2002 | Schlager |
| 2004/0028242 | A1 | 2/2004 | Kitamura |
| 2005/0122166 | A1 | 6/2005 | Premakanthan et al. |
| 2006/0274904 | A1 | 12/2006 | Lashkari |
| 2007/0098190 | A1 | 5/2007 | Song et al. |
| 2009/0180636 | A1 | 7/2009 | Su et al. |
| 2011/0182435 | A1 | 7/2011 | Gautama |
| 2012/0203526 | A1 | 8/2012 | Bai et al. |
| 2012/0289809 | A1 | 11/2012 | Kaib et al. |
| 2013/0094657 | A1 | 4/2013 | Brammer et al. |
| 2014/0051483 | A1 | 2/2014 | Schoerkmaier |
| 2014/0254805 | A1 * | 9/2014 | Su .......................... H04R 3/007 381/55 |
| 2014/0254827 | A1 | 9/2014 | Bailey et al. |
| 2014/0286500 | A1 | 9/2014 | Iwamoto et al. |
| 2015/0010171 | A1 | 1/2015 | Pernici et al. |
| 2015/0281844 | A1 | 10/2015 | Stabile |
| 2015/0319529 | A1 | 11/2015 | Klippel et al. |
| 2016/0014486 | A1 * | 1/2016 | Macours ................. H04R 1/02 381/111 |
| 2016/0134982 | A1 | 5/2016 | Iyer |
| 2016/0373858 | A1 | 12/2016 | Lawrence et al. |
| 2017/0055067 | A1 | 2/2017 | Moro et al. |
| 2017/0188150 | A1 * | 6/2017 | Brunet ..................... H04R 3/08 |
| 2017/0272045 | A1 | 9/2017 | Chadha |
| 2017/0318388 | A1 | 11/2017 | Risberg et al. |
| 2017/0345438 | A1 | 11/2017 | Thyssen |
| 2018/0014120 | A1 | 1/2018 | Lawrence et al. |
| 2018/0034430 | A1 | 2/2018 | Ahmed et al. |
| 2018/0192192 | A1 | 7/2018 | Brunet et al. |
| 2019/0281385 | A1 | 9/2019 | Brunet et al. |

FOREIGN PATENT DOCUMENTS

| | | | |
|---|---|---|---|
| EP | 2642769 | A1 | 9/2013 |
| EP | 3079375 | A1 | 10/2016 |
| JP | 3433342 | B2 | 8/2003 |
| JP | 2004312141 | A | 11/2004 |
| JP | 20050129977 | A | 5/2005 |
| JP | 2007060648 | A | 3/2007 |
| JP | 2007081815 | A | 3/2007 |
| JP | 2015082754 | A | 4/2015 |
| JP | 2015084499 | A | 4/2015 |
| JP | 6182869 | 32 | 8/2017 |
| KR | 10-20050023841 | A | 3/2005 |
| KR | 10-20140097874 | A | 8/2014 |
| KR | 101445186 | B1 | 10/2014 |
| WO | 2013182901 | A1 | 12/2013 |
| WO | 2014045123 | A | 3/2014 |
| WO | 2015143127 | A | 9/2015 |
| WO | 2015191691 | A1 | 12/2015 |
| WO | 2017088876 | A2 | 6/2017 |

OTHER PUBLICATIONS

U.S. Advisory Action for Application U.S. Appl. No. 15/835,245, dated Apr. 11, 2019.
International Search Report and Written Opinion dated Apr. 29, 2019 for International Application PCT/KR2019/000702 from Korean Intellectual Property Office, pp. 1-10, Republic of Korea.
U.S.Notice of Allowance for Application U.S. Appl. No. 15/835,245 dated May 6, 2019.
International Search Report and Written Opinion dated Mar. 31, 2017 for International Application PCT/KR2016/015435 from Korean Intellectual Property Office, pp. 1-12, Republic of Korea.
U.S. Final Office Action for Application U.S. Appl. No. 15/835,245 dated Jan. 10, 2019.
U.S. Notice of Allowance for Application U.S. Appl. No. 16/057,711 dated Apr. 2, 2019.
U.S. Non-Final Office Action for Application U.S. Appl. No. 15/391,633 dated Mar. 28, 2019.
International Search Report and Written Opinion dated Apr. 20, 2018 for International Application PCT/KR2018/000016 from Korean Intellectual Property Office, pp. 1-5, Republic of Korea.
U.S. Non-Final Office Action for Application U.S. Appl. No. 15/835,245 dated Jun. 14, 2018.
Extended European Search Report dated Jul. 23, 2018 for European Application No. 16882101.5 from European Patent Office, pp. 1-8, Munich, Germany.
Hu, Y. et al., "Effects of the Cone and Edge on the Acoustic Characteristics of a Cone Loudspeaker", Advances Acoustics in and Vibration, May 21, 2017, pp. 1-12, vol. 2017, Hindawi, Japan.
Thomsen, S. et. al., "Design and Analysis of a Flatness-Based Control Approach for Speed Control of Drive Systems with Elastic Couplings and Uncertain Loads," Proceedings of the 2011—14th European Conference (EPE 2011), Aug. 30-Sep. 30, 2011; pp. 1-10, IEEE Press, United States.
Fliess, M. et al., "Flatness and Defect of Nonlinear Systems: Introductory Theory and Examples", International Journal of Control, Jun. 1995, pp. 1327-1361, vol. 61, Taylor & Francis, United Kingdom.
Papazoglou, N. et al., "Linearisation par Asservissement d'unhaut-parleur electrodynamique: approche par les Systemes Hamiltoniens a Ports", Memoire De Fin D Etude M2R SAR Parcout ATIAM, pp. 1-52, Aug. 11, 2014.
ProSoundWeb, "Harman Unveils JBL 3 Series MK II Powered Studio Monitors," Jan. 2018, pp. 1-4, EH Publishing, United States, downloaded at: https://www.prosoundweb.com/channels/recording/harman-unveils-jbl-3-series-mkii-powered-studio-monitors/.
International Search Report and Written Opinion dated May 7, 2019 for International Application PCT/KR2019/001090 from Korean Intellectual Property Office, pp. 1-13, Republic of Korea.
International Search Report dated Jun. 21, 2019 for International Application PCT/KR2019/002741 from Korean Intellectual Property Office, pp. 1-3, Republic of Korea.
U.S. Supplemental Notice of Allowability for Application U.S. Appl. No. 15/835,245 dated Jul. 15, 2019.
U.S. Supplemental Notice of Allowability for Application U.S. Appl. No. 15/835,245 dated Aug. 28, 2019.

(56) References Cited

OTHER PUBLICATIONS

U.S. Notice of Allowance for Application U.S. Appl. No. 16/057,711 dated Sep. 17, 2019.
U.S. Notice of Allowance for U.S. Appl. No. 15/391,633 dated Sep. 18, 2019.
U.S. Supplemental Notice of Allowability for U.S. Appl. No. 15/835,245 dated Oct. 1, 2019.

\* cited by examiner

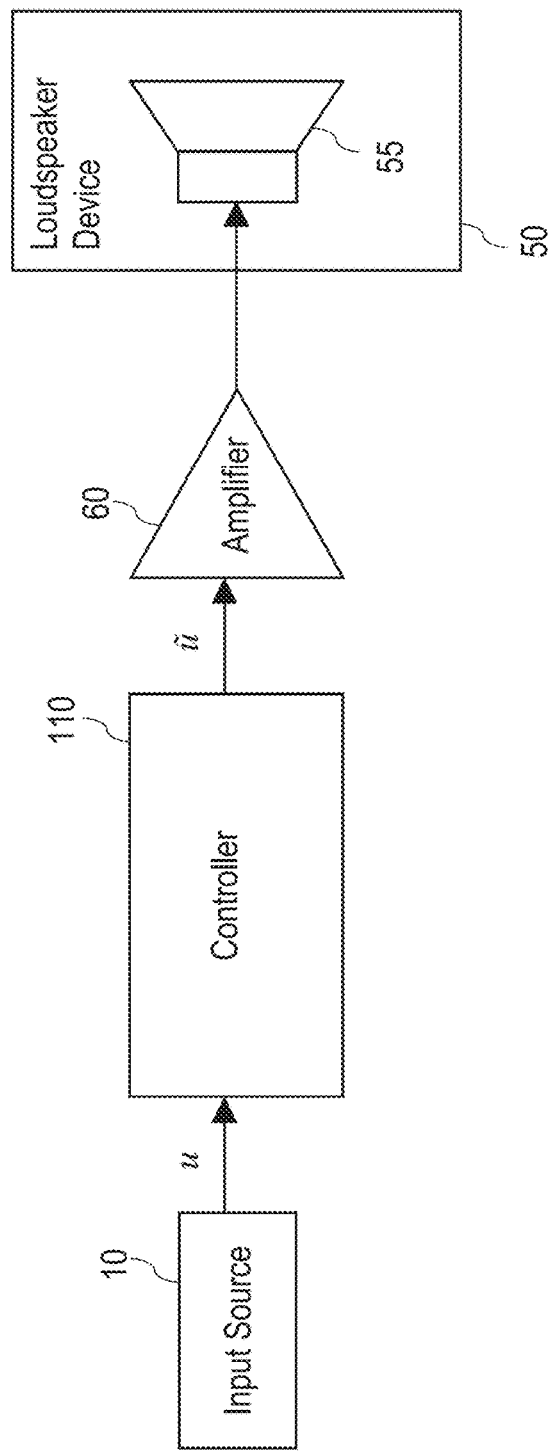

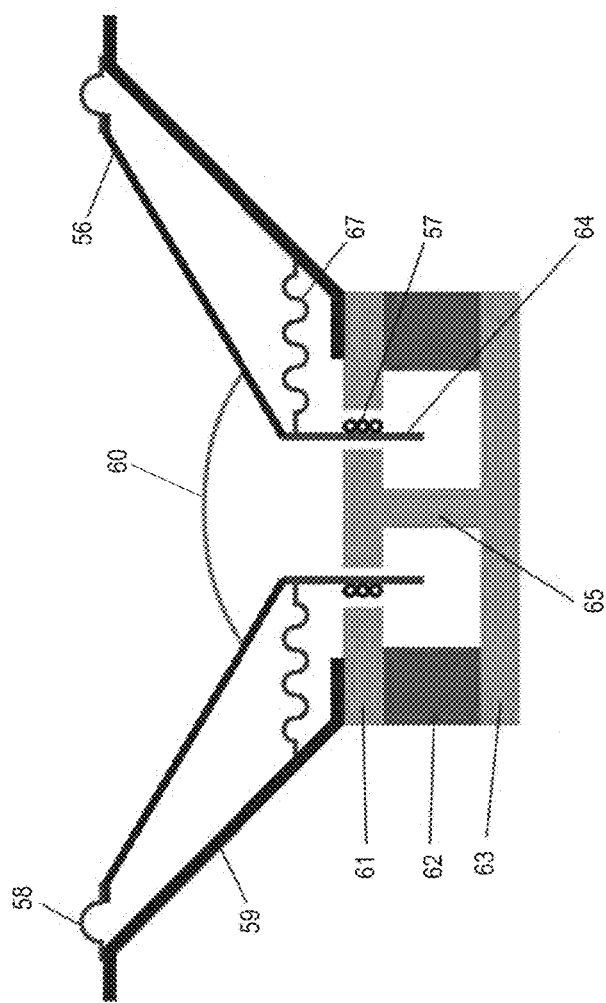

NONLINEAR CONTROL OF VENTED BOX OR PASSIVE RADIATOR LOUDSPEAKER SYSTEMS

TECHNICAL FIELD

One or more embodiments relate generally to loudspeakers, and in particular, a method and system for nonlinear control of motion of a speaker driver.

BACKGROUND

A loudspeaker produces sound when connected to an integrated amplifier, a television (TV) set, a radio, a music player, an electronic sound producing device (e.g., a smartphone, a computer), a video player, etc.

SUMMARY

One embodiment provides a vented box loudspeaker system comprising a speaker driver including a diaphragm and a controller. The controller is configured to receive a source signal for reproduction via the speaker driver, determine a target displacement of the diaphragm and a target sound pressure in the vented box loudspeaker system based on a first physical model of the vented box loudspeaker system, and generate a control voltage based on the target displacement, the target sound pressure, and a second physical model of the vented box loudspeaker system. An actual displacement of the diaphragm during the reproduction of the source signal is controlled based on the generated control voltage.

Another embodiment provides a passive radiator loudspeaker system comprising an active speaker driver including a diaphragm and a controller. The controller is configured to receive a source signal for reproduction via the active speaker driver, determine a target displacement of a component of the passive radiator loudspeaker system based on a first physical model of the passive radiator loudspeaker system, and generate a control voltage based on the target displacement and a second physical model of the passive radiator loudspeaker system. An actual displacement of the diaphragm of the active speaker driver during the reproduction of the source signal is controlled based on the generated control voltage.

One embodiment provides a method comprising receiving a source signal for reproduction via a speaker driver of a loudspeaker device, determining a target displacement of a component of the loudspeaker device based on a first physical model of the loudspeaker device, and generating a control voltage based on the target displacement and a second physical model of the loudspeaker device. An actual displacement of a diaphragm of the speaker driver during the reproduction of the source signal is controlled based on the generated control voltage.

These and other features, aspects and advantages of the one or more embodiments will become understood with reference to the following description, appended claims, and accompanying figures.

BRIEF DESCRIPTION OF THE DRAWINGS

FIG. 1 illustrates an example nonlinear control system, in accordance with an embodiment;

FIG. 2A illustrates a cross section of an example active speaker driver of a loudspeaker device, in accordance with an embodiment;

DETAILED DESCRIPTION

Figure 2B:
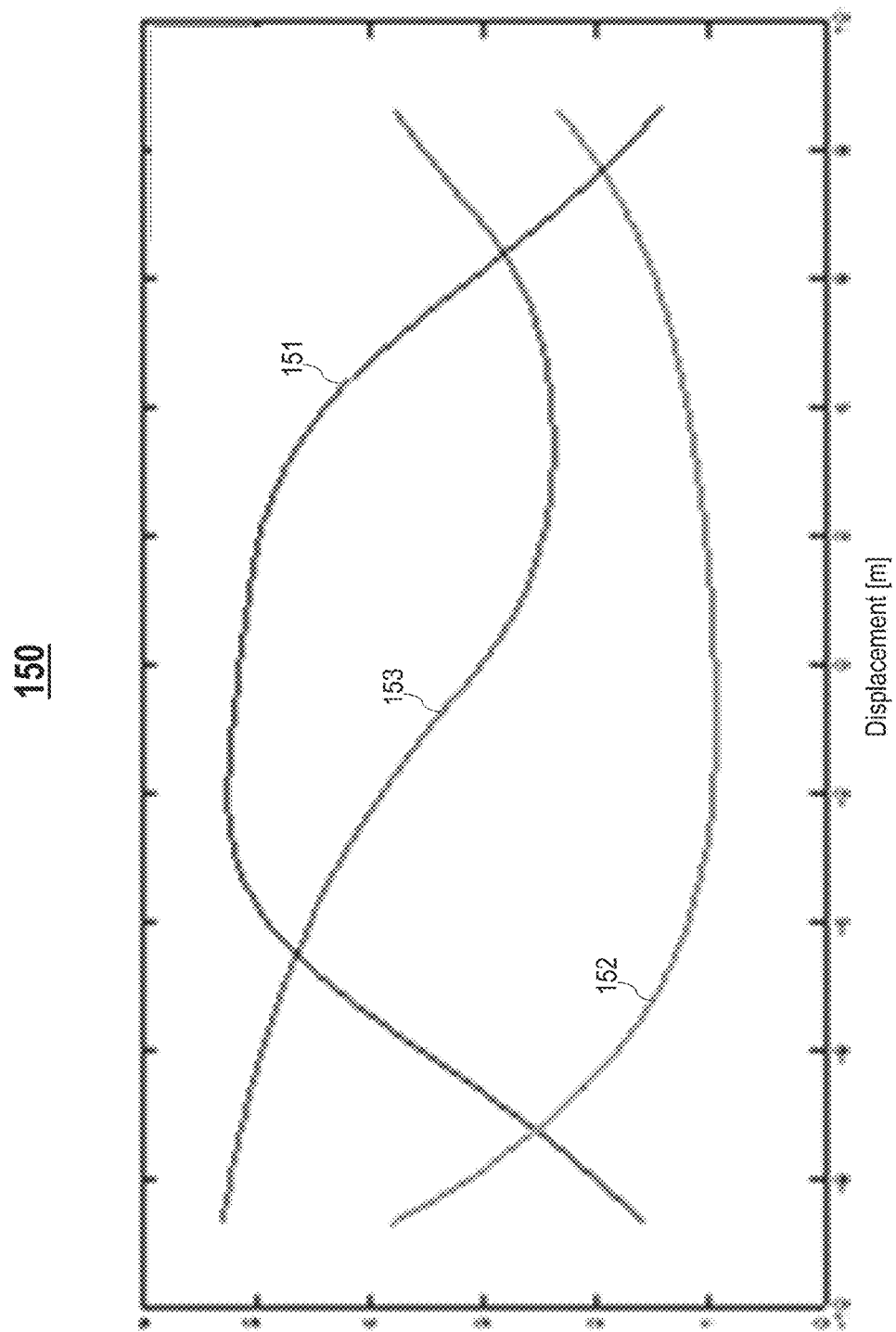
FIG. 2B is an example graph illustrating nonlinear dynamics of different electromechanical parameters for an active speaker driver, in accordance with an embodiment.

The following description is made for the purpose of illustrating the general principles of one or more embodiments and is not meant to limit the inventive concepts claimed herein. Further, particular features described herein can be used in combination with other described features in each of the various possible combinations and permutations. Unless otherwise specifically defined herein, all terms are to be given their broadest possible interpretation including meanings implied from the specification as well as meanings understood by those skilled in the art and/or as defined in dictionaries, treatises, etc.

One or more embodiments relate generally to loudspeakers, and in particular, a method and system for nonlinear control of motion of a speaker driver. One embodiment provides a vented box loudspeaker system comprising a speaker driver including a diaphragm and a controller. The controller is configured to receive a source signal for reproduction via the speaker driver, determine a target displacement of the diaphragm and a target sound pressure in the vented box loudspeaker system based on a first physical model of the vented box loudspeaker system, and generate a control voltage based on the target displacement, the target sound pressure, and a second physical model of the vented box loudspeaker system. An actual displacement of the diaphragm during the reproduction of the source signal is controlled based on the generated control voltage.

Another embodiment provides a passive radiator loudspeaker system comprising an active speaker driver including a diaphragm and a controller. The controller is configured to receive a source signal for reproduction via the active speaker driver, determine a target displacement of a component of the passive radiator loudspeaker system based on a first physical model of the passive radiator loudspeaker system, and generate a control voltage based on the target displacement and a second physical model of the passive radiator loudspeaker system. An actual displacement of the diaphragm of the active speaker driver during the reproduction of the source signal is controlled based on the generated control voltage.

One embodiment provides a method comprising receiving a source signal for reproduction via a speaker driver of a loudspeaker device, determining a target displacement of a component of the loudspeaker device based on a first physical model of the loudspeaker device, and generating a control voltage based on the target displacement and a second physical model of the loudspeaker device. An actual displacement of a diaphragm of the speaker driver during the reproduction of the source signal is controlled based on the generated control voltage.

For expository purposes, the terms "loudspeaker" and "loudspeaker device" may be used interchangeably in this specification.

For expository purposes, the terms "vented box" and "vented box loudspeaker system" may be used interchangeably in this specification.

For expository purposes, the terms "displacement" and "excursion" may be used interchangeably in this specification.

A conventional loudspeaker is nonlinear by design and produces harmonics, intermodulation components, and modulation noise. Nonlinear audio distortion impairs sound quality of audio produced by the loudspeaker (e.g., audio quality and speech intelligibility). In recent times, industrial design constraints often require loudspeaker systems to be smaller-sized for portability and compactness. Such design constraints, however, trade size and portability for sound quality, resulting in increased audio distortion. As such, an anti-distortion system for reducing/removing audio distortion is needed, in particular for obtaining a more pronounced/bigger bass sound from smaller-sized loudspeaker systems.

One or more embodiments provide a nonlinear control system for a loudspeaker device including an active speaker driver. The nonlinear control system enables linearization of the loudspeaker device by providing nonlinear control of cone motion of one or more moving components (e.g., a diaphragm and/or a driver voice coil) of the active speaker driver. In some embodiments, the loudspeaker device is a ported loudspeaker (e.g., a vented box loudspeaker system) including the active speaker driver and at least one ported enclosure (e.g., port/vent). In some embodiments, the loudspeaker device is a passive radiator loudspeaker system including the active speaker driver and at least one passive radiator.

In one embodiment, the nonlinear control system is configured to determine, at each instant (e.g., each moment or sampling time) since receipt of an input voltage for driving the loudspeaker device, the following: (1) a corresponding target displacement (e.g., target cone displacement) of the one or more moving components based on a target (i.e., desired) sound pressure, and (2) a corresponding control voltage that produces the corresponding target displacement. The input voltage received is indicative of the target sound pressure suitable for producing an input audio signal associated with the input voltage. The nonlinear control system controls cone motion of the one or more moving components at each instant in accordance with a corresponding control voltage determined for the instant, resulting in production of a target (i.e., desired) sound wave with the target sound pressure. An actual displacement of the one or more moving components at each instant is based on a corresponding target displacement determined for the instant, thereby preventing excessive displacement (i.e., excursion) of the one or more moving components.

The nonlinear control system compensates for nonlinear audio distortion effectively. By controlling actual displacement of the one or moving components, the nonlinear control system allows for bass extension, thereby enhancing bass output of the loudspeaker device. By preventing excessive displacements of the one or more moving components and overheating of the loudspeaker device as a result of excessive displacements, the nonlinear control system provides mechanical protection of the loudspeaker device.

In one example implementation, at each instant since receipt of the input voltage, the nonlinear control system is further configured to: (1) determine a nominal amount of voltage required to obtain a corresponding target displacement determined for the instant based on a physical model of the loudspeaker device (e.g., a physical model of a vented box loudspeaker system or a physical model of a passive radiator loudspeaker system), (2) monitor an amount of current drawn by the loudspeaker device, (3) determine an estimated (i.e., predicted) displacement of the one or more moving components based on the amount of current drawn, and (4) perform voltage correction on the input voltage received based on a difference between the estimated displacement and the target displacement, if any. In one embodiment, the voltage correction performed involves correcting feedforward control voltage. In one embodiment, the voltage correction performed may compensate for one or more inaccuracies (e.g., manufacturing dispersion) associated with the physical model utilized and/or audio drifting (e.g., resulting from overheating of the loudspeaker device due to excessive displacements).

Compared to conventional loudspeakers, one or more embodiments provide improved performance in terms of nonlinear audio distortion and power consumption. Further, one or more embodiments enable nonlinear control of a ported loudspeaker or a passive radiator loudspeaker system.

FIG. 1 illustrates an example nonlinear control system 100, in accordance with an embodiment. The nonlinear control system 100 comprises a loudspeaker device 50 including an active speaker driver 55 for reproducing sound. In one embodiment, as described in detail later herein, the loudspeaker device 50 is a ported loudspeaker (e.g., a vented box loudspeaker system) comprising the active speaker driver 55 and at least one ported enclosure. In another embodiment, as described in detail later herein, the loudspeaker device 50 is a passive radiator loudspeaker system comprising the active speaker driver 55 and at least one passive radiator.

In one embodiment, the active speaker driver 55 is a forward-facing speaker driver. In another embodiment, the active speaker driver 55 is an upward-facing driver. In yet another embodiment, the active speaker driver 55 is a downward-facing driver. As described in detail later herein, the active speaker driver 55 comprises one or more moving components, such as a diaphragm 56 (FIG. 2A) and a driver voice coil 57 (FIG. 2A).

Let u generally denote an input voltage received at the nonlinear control system 100 for driving the active speaker driver 55. As described in detail later herein, the nonlinear control system 100 further comprises a controller 110 configured to receive a source signal (e.g., an input audio signal) with an input voltage u from an input source 10. The controller 110 is further configured to determine, based on at least one physical model of the loudspeaker device 50, one or more of the following: (1) a target displacement x* of the one or more moving components (e.g., diaphragm 56 and/or driver voice coil 57) at a sampling time t, (2) a target sound pressure p* in the loudspeaker device 50 at the sampling time t, and (3) a control voltage ũ that produces the target displacement x* at the sampling time t.

In one embodiment, the nonlinear control system 100 further comprises an amplifier 60 connected to the loudspeaker device 50 and the controller 110. In one embodiment, the amplifier 60 is a voltage amplifier configured to amplify the source signal based on the control voltage ũ, thereby controlling an actual displacement of the one or more moving components during the reproduction of the source signal. Specifically, the nonlinear control system 100 controls cone motion of the one or more moving components by performing voltage correction based on the corresponding control voltage ũ, resulting in production of a target sound wave with a target sound pressure. The control voltage ũ limits an actual displacement of the one or more moving components within a predetermined range of safe displacement. In another embodiment, the amplifier 60 is a current amplifier instead.

In one embodiment, the controller 110 is configured to receive a source signal from different types of input sources 10. Examples of different types of input sources 10 include, but are not limited to, a mobile electronic device (e.g., a smartphone, a laptop, a tablet, etc.), a content playback device (e.g., a television, a radio, a computer, a music player such as a CD player, a video player such as a DVD player, a turntable, etc.), or an audio receiver, etc.

In one embodiment, the nonlinear control system 100 may be integrated in, but not limited to, one or more of the following: a computer, a smart device (e.g., smart TV), a subwoofer, wireless and portable speakers, car speakers, etc.

In one embodiment, the controller 110 utilizes different physical models for the loudspeaker device 50. In one example implementation, as described in detail later herein, at least one physical model utilized by the controller 110 is a linear model (e.g., a linear state-space model), and at least one other physical model utilized by the controller 110 is a nonlinear model. A physical model of the loudspeaker device 50 may be based on one or more loudspeaker parameters for the loudspeaker device 50.

FIG. 2A illustrates a cross section of an example active speaker driver 55 of a loudspeaker device 50, in accordance with an embodiment. The active speaker driver 55 comprises one or more moving components, such as a diaphragm 56 (e.g., a cone-shaped diaphragm) and a driver voice coil 57. The active speaker driver 55 further comprises one or more of the following components: (1) a surround roll 58 (e.g., suspension roll), (2) a basket 59, (3) a protective cap 60 (e.g., a dome-shaped dust cap), (4) a top plate 61, (5) a magnet 62, (6) a bottom plate 63, (7) a pole piece 65, (8) a former 64, and (9) a spider 67.

Example loudspeaker parameters for the loudspeaker device 50 include, but are not limited to, the following electromechanical parameters for the active speaker driver 55: (1) an electrical direct current (DC) resistance $R_e$ of the driver voice coil 57, (2) a mechanical resistance $R_m$ of total losses of the active speaker driver 55 (i.e., mechanical losses), (3) a mechanical mass $M_m$ of the diaphragm 56 (i.e., moving mass), the driver voice coil 57, and air load, (4) a suspension stiffness factor $K_m$ of the surround roll 58, (5) a force factor Bl of the driver voice coil 57, (6) an inductance $L_e$ of the driver voice coil 57, and (7) a surface area $S_d$ of the diaphragm 56.

A state of the loudspeaker device 50 at each instant is described using each of the following: (1) an estimated (i.e., predicted) displacement x of one or more moving components (e.g., diaphragm 56 and/or driver voice coil 57) of the active speaker driver 55, (2) a velocity ẋ of the one or more moving components, and (3) a current I drawn through the drive voice coil 57.

FIG. 2B is an example graph 150 illustrating nonlinear dynamics of different electromechanical parameters for a speaker driver 55, in accordance with an embodiment. A horizontal axis of the graph 150 represents displacement of the one or more moving components (e.g., diaphragm 56 and/or driver voice coil 57) in m. The graph 150 comprises each of the following: (1) a first curve 151 representing changes in force factor Bl in Newton per Ampere (N/A), (2) a second curve 152 representing changes in suspension stiffness factor $K_m$ in Newton per m (N/m), and (3) a third curve 153 representing changes in inductance $L_e$ in millihenry (mH).

Figure 3A:
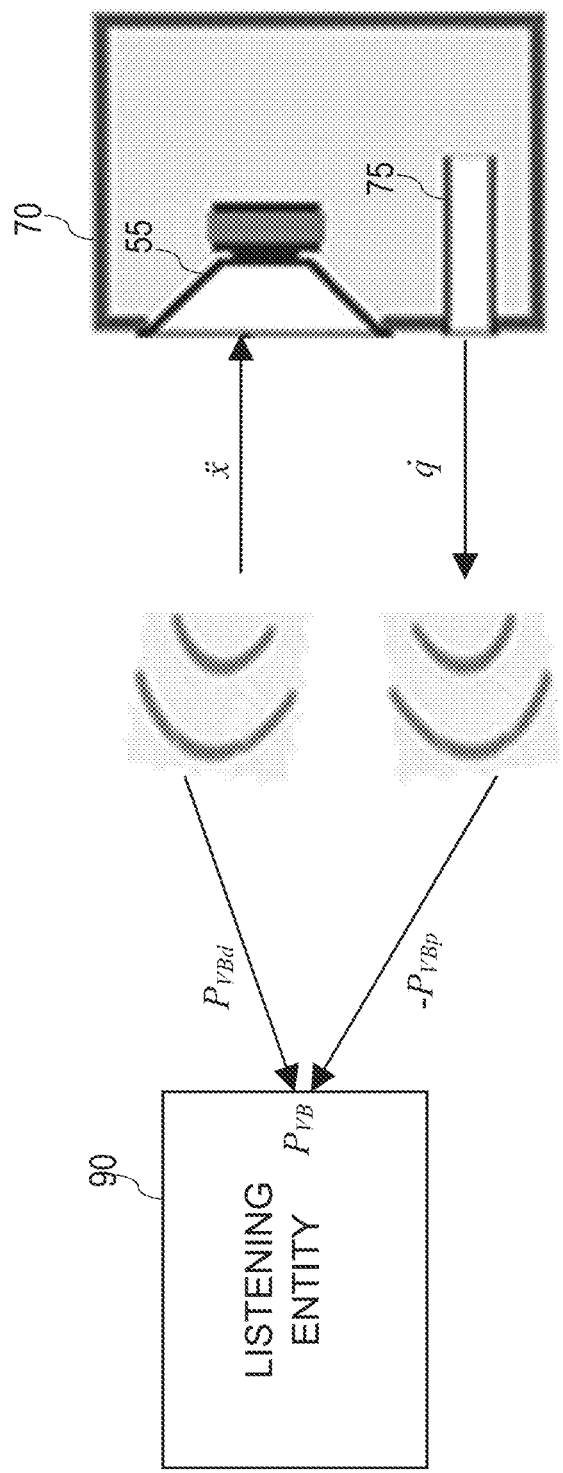
FIG. 3A illustrates sound pressure of a vented box loudspeaker system, in accordance with an embodiment.

FIG. 3A illustrates sound pressure in a vented box loudspeaker system 70, in accordance with an embodiment. As stated above, in one embodiment, the loudspeaker device 50 is a vented box loudspeaker system 70 comprising an active speaker driver 55 and a ported enclosure 75 (e.g., port/vent). A vented box loudspeaker system 70 has increased efficiency at low sound frequencies, thereby allowing the vented box loudspeaker system 70 to attain significantly more bass output compared to a closed-box loudspeaker. Specifically, at low sound frequencies, the ported enclosure 75 becomes a predominant sound source that complements one or more moving components (e.g., diaphragm 56 and/or driver voice coil 57) of the active speaker driver 55, resulting in a bass level boost (i.e., enhanced bass output) that is limited through to a narrow sound frequency range.

Let $P_{VBd}$ generally denote a sound pressure created by the one or more moving components, let $P_{VBp}$ generally denote a sound pressure in the ported enclosure 75, and let $P_{VB}$ generally denote a total sound pressure received at a listening entity 90 (e.g., a listener's ear, a microphone, etc.) that is within proximity of the vented box loudspeaker system 70. The sound pressure $P_{VBd}$, the sound pressure $P_{VBp}$, and the total sound pressure $P_{VB}$ may be determined in accordance with equations (1)-(3) provided below:

$$P_{VBd} = \rho S_d \ddot{x}/(2\pi r) \quad (1),$$

$$P_{VBp} = \rho \dot{q}/(2\pi r) \quad (2), \text{ and}$$

$$P_{VB} = P_{PRd} - P_{VBp} \quad (3),$$

wherein ρ is the density of air, ẍ denotes the acceleration of a moving component (e.g., diaphragm), r denotes a distance in meters (m) between the listening entity 90 and the vented box loudspeaker system 70, and q̇ denotes the volume acceleration of air in the ported enclosure 75. As shown in FIG. 3A, air from the ported enclosure 75 moves outward when air from the one or more moving components moves inward. As such, the sound pressure $P_{VBp}$ is denoted as a negative value in FIG. 3A, and the sound pressure $P_{VBp}$ is subtracted from the sound pressure P PRd in equation (3).

In addition to electromechanical parameters for the active speaker driver 55, additional loudspeaker parameters for the vented box loudspeaker system 70 include, but are not limited to, the following: (1) an acoustic resistance $R_a$ of total losses of the ported enclosure 75, (2) an acoustic mass $M_a$ of air in the ported enclosure 75, (3) an acoustic stiffness factor $K_{VBb}$ of air in the ported enclosure 75, (4) a volume velocity q in the port, and (5) a sound pressure p in the vented box loudspeaker system 70.

Figure 3B:
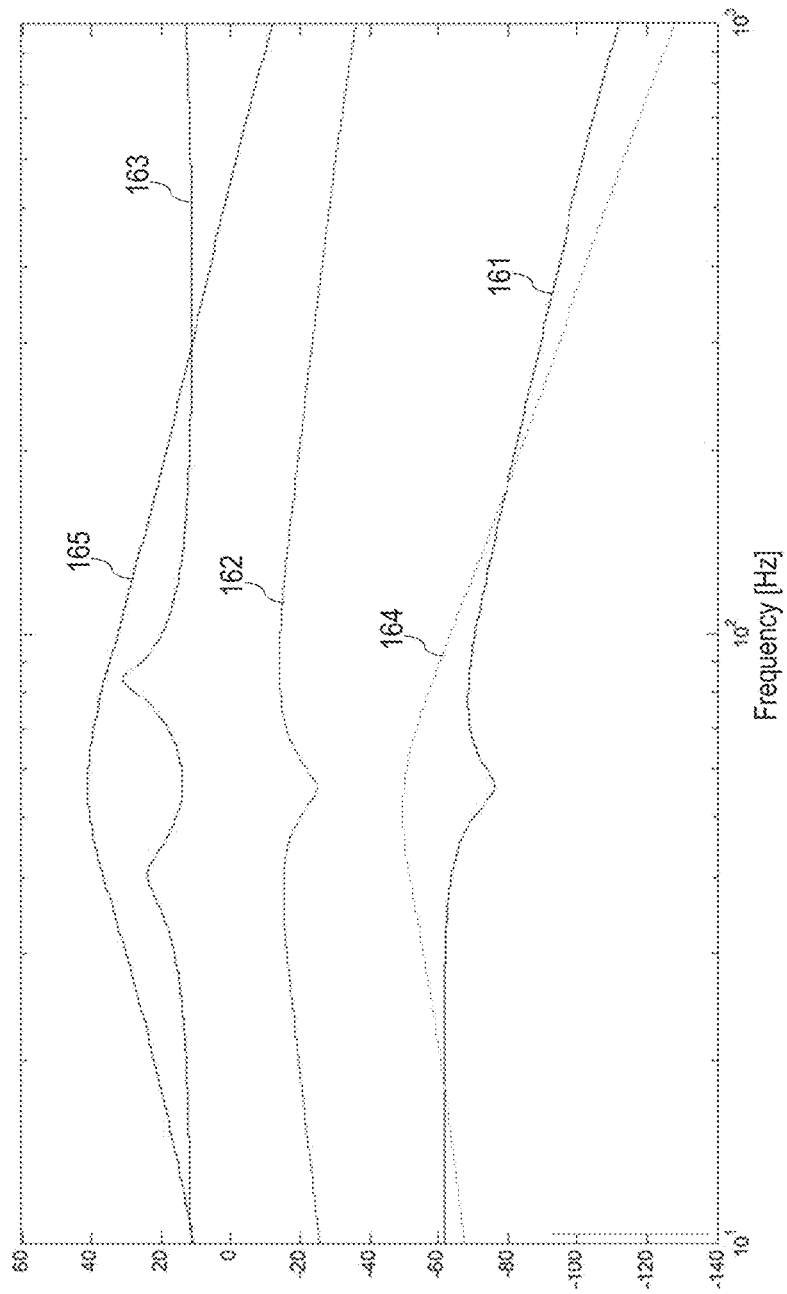
FIG. 3B is an example graph illustrating frequency responses of different loudspeaker parameters for a vented box loudspeaker system, in accordance with an embodiment.

FIG. 3B is an example graph 160 illustrating frequency responses of different loudspeaker parameters for a vented box loudspeaker system, in accordance with an embodiment. A horizontal axis of the graph 160 represents frequency in Hertz (Hz). The graph 160 comprises each of the following: (1) a first curve 161 representing frequency response of estimated displacement x of one or more moving components (e.g., diaphragm and/or driver voice coil) of a vented box loudspeaker system (e.g., vented box loudspeaker system 70) in meter per volt (m/V), (2) a second curve 162 representing frequency response of velocity $\dot{x}$ of the one or more moving components in meter per second per volt (m/s/V), (3) a third curve 163 representing frequency response of impedance Z of an active speaker driver of the vented box loudspeaker system in ohms, (4) a fourth curve 164 representing frequency response of volume velocity q in a ported enclosure of the vented box loudspeaker system in cubic meter per second per volt (m³/s/V), and (5) a fifth curve 165 representing frequency response of sound pressure p in the vented box loudspeaker system in pascal per volt (Pa/V).

Figure 4:
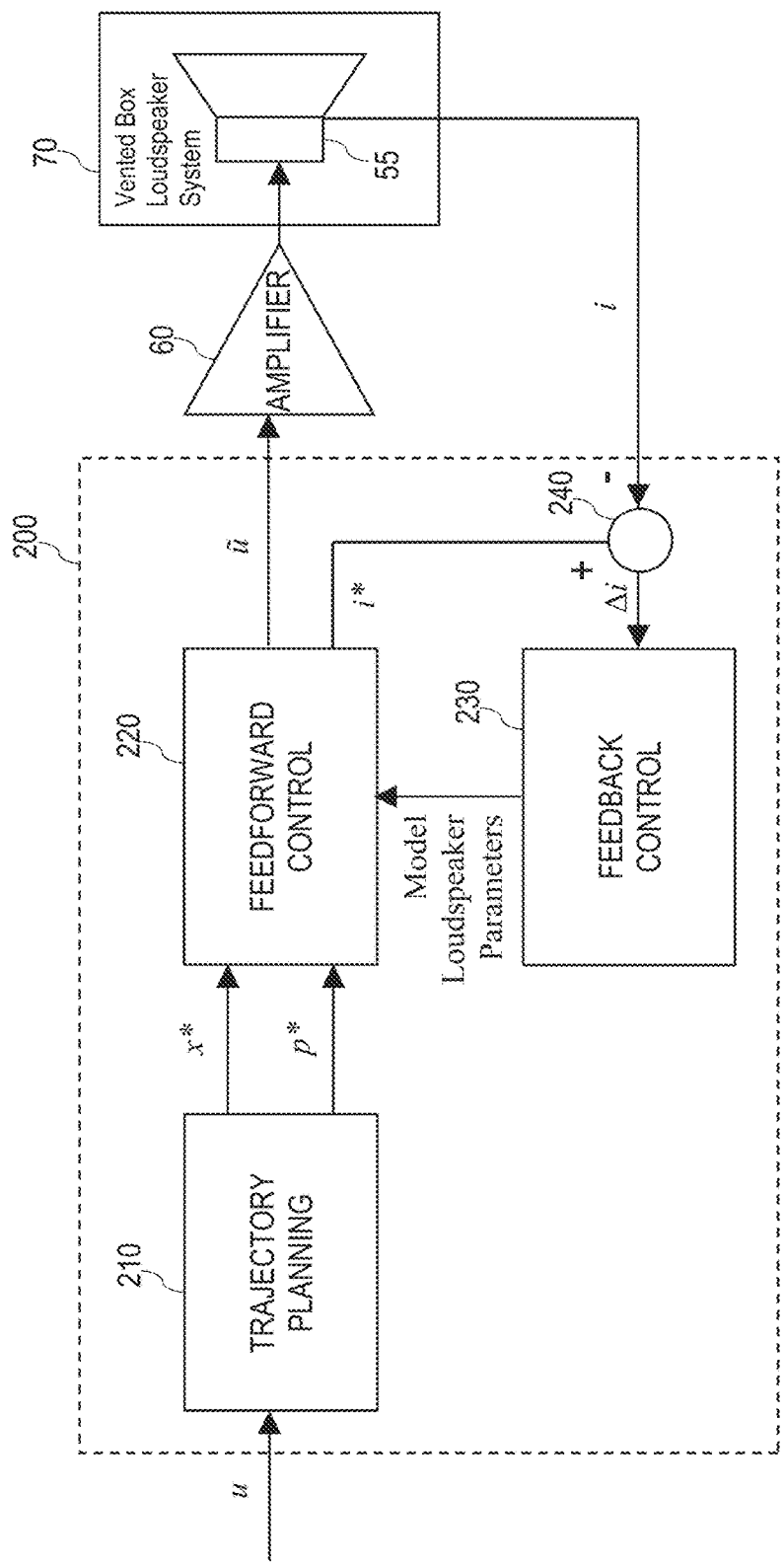
FIG. 4 illustrates an example controller for a vented box loudspeaker system, in accordance with an embodiment.

FIG. 4 illustrates an example controller 200 for the vented box loudspeaker system 70, in accordance with an embodiment. In one embodiment, the controller 110 of the nonlinear control system 100 is the controller 200. As described in detail later herein, the controller 200 comprises a trajectory planning unit 210 for determining one or more linear values, and a feedforward control unit 220 for determining one or more nonlinear values.

In one embodiment, the trajectory planning unit 210 is configured to: (1) determine a target displacement x* of one or more moving components (e.g., diaphragm 56 and/or driver voice coil 57) of the vented box loudspeaker system 70 at each sampling time t based on an input voltage u received from an input source 10 and at least one physical model of the vented box loudspeaker system 70, and (2) determine a target sound pressure p* in the vented box loudspeaker system 70 at the sampling time t based on the input voltage u and the at least one physical model of the vented box loudspeaker system 70.

In one embodiment, the trajectory planning unit 210 utilizes a linear state-space model of the vented box loudspeaker system 70 to determine a target displacement x* and a target sound pressure p*. For example, in one embodiment, linear dynamics of the vented box loudspeaker system 70 may be represented in accordance with equations (4)-(7) provided below.

Let $X_{VB}(t)$ generally denote a vector representing a state ("state vector representation") of the vented box loudspeaker system 70 at a sampling time t, wherein the state vector representation $X_{VB}(t)$ is defined in accordance with equation (4) provided below:

$$X_{VB}(t)=[x,\dot{x},i,q,p]^T \quad (4),$$

wherein x is a velocity of the one or more moving components For expository purposes, the terms $X_{VB}(t)$ and $X_{VB}$ are used interchangeably in this specification.

In one embodiment, an acoustic resistance $R_{VB}$ and an acoustic mass $M_a$ associated with the ported enclosure 75 may be functions of one or more variables of the state vector representation $X_{VB}$, such as a volume velocity q in the ported enclosure 75.

Let $A_{VB}$ and $B_{VB}$ generally denote constant parameter matrices. In one embodiment, the constant parameter matrices $A_{VB}$ and $B_{VB}$ are represented in accordance with equations (5)-(6) provided below:

$$A_{VB} = \begin{bmatrix} 0 & 1 & 0 & 0 & 0 \\ -K_m/M_m & -R_m/M_m & Bl/M_m & 0 & -S_d/M_m \\ 0 & -Bl/L_e & -R_eL_e & 0 & 0 \\ 0 & 0 & 0 & -R_a/M_a & 1/M_a \\ 0 & K_{VBd}S_d & 0 & -K_{VBb} & 0 \end{bmatrix}, \quad (5)$$

and $$B_{VB} = \begin{bmatrix} 0 \\ 0 \\ 1/L_e \\ 0 \\ 0 \end{bmatrix}. \quad (6)$$

Let $\dot{X}_{VB}$ generally denote a time derivative (i.e., rate of change) of the state vector representation $X_{VB}$ of the vented box loudspeaker system 70 ("state vector rate of change"), wherein the state vector rate of change $\dot{X}_{VB}$ is defined in accordance with a differential equation (7) provided below:

$$\dot{X}_{VB}=A_{VB}X_{VB}+B_{VB}u \quad (7).$$

The trajectory planning unit 210 is configured to determine a target displacement x* and a target sound pressure p* at each sampling time t based on equation (7) as provided above.

In one embodiment, the feedforward control unit 220 is configured to: (1) determine, based on a target displacement x* and a target sound pressure p* for a sampling time t received from the trajectory planning unit 210 and at least one other physical model of the vented box loudspeaker system 70, a control voltage ũ that can produce the target displacement x*, and (2) determine, based on the target displacement x*, the target sound pressure p*, and the at least one other physical model of the vented box loudspeaker system 70, a target current i* to draw through the active speaker driver 55 to produce the target displacement x*.

In one embodiment, the feedforward control unit 220 utilizes a nonlinear model for the vented box loudspeaker system 70 to determine a control voltage ũ and a target current i*. For example, in one embodiment, nonlinear dynamics for the vented box loudspeaker system 70 may be represented in accordance with equations (8)-(12) provided below:

$$M_m\ddot{x}+K_m(x)x+R_m\dot{x}+S_dp=Bl(x)i \quad (8),$$

wherein equation (8) represents a mechanical equation for the active speaker driver 55, $$Bl(x)\dot{x}+R_ei+\partial\{L_e(x)i\}/\partial t=u \quad (9),$$

wherein equation (9) represents an electrical equation for the active speaker driver 55, $$p = M_a \dot{q} + R_a q \quad (10), \text{ and}$$

$$p = (S_d \dot{x} - q) K_{VBb} \quad (11),$$

wherein equations (10)-(11) represent port equations for the ported enclosure 75. The port equations (10)-(11) define a linear state-space system of 2nd order with input $\dot{x}$, as represented by equation (12) provided below:

$$\begin{bmatrix} \dot{q} \\ \dot{p} \end{bmatrix} = \begin{bmatrix} -R_a/M_a & 1/M_a \\ -K_{VBb} & 0 \end{bmatrix} \begin{bmatrix} q \\ p \end{bmatrix} + \begin{bmatrix} 0 \\ S_d \end{bmatrix} \dot{x} \quad (12)$$

In one embodiment, the feedforward control unit 220 implements feedforward control to determine a control voltage ũ for each sampling time t. For example, in one embodiment, the feedforward control unit 220 performs a set of computations that include determining a target current i* to draw through the active speaker driver 55 for a sampling time t based on equation (13) as provided below:

$$i^* = (M_m \ddot{x} + R_m \dot{x} + K_m(x)x + S_d p) Bl^{-1}(x) \quad (13),$$

wherein equation (13) is derived from equation (8) provided above, and a target displacement x* and a target sound pressure p* received from the trajectory planning unit 210 for the sampling time t are used as inputs (i.e., inputs x and p in equation (13) are substituted with x* and p* instead).

The set of computations performed by the feedforward control unit 220 further include determining a control voltage ũ for a sampling time t based on equation (14) provided below:

$$\tilde{u} = Bl(x)\dot{x} + R_e i + \partial \{L_e(x)i\}/\partial t \quad (14),$$

wherein equation (14) is derived from equation (9) provided above, and a target displacement x* received from the trajectory planning unit 210 and a target current i* (determined in accordance with equation (13) provided above) for the sampling time t are used as inputs (i.e., inputs x and i in equation (14) are substituted with x* and i* instead).

In one embodiment, the amplifier 60 is a voltage amplifier configured to amplify the source signal based on a control voltage ũ received from the feedforward control unit 220. In another embodiment, the amplifier 60 is a current amplifier configured to amplify the source signal based on a target current i* received from the feedforward control unit 220.

In one embodiment, the controller 200 is configured to monitor a current i drawn through the vented box loudspeaker system 70 at each sampling time t and determine a prediction error for correcting the feedforward control implemented by the feedback control unit 220 based on a comparison between the measured current i and a target current i* for the sampling time t. For example, in one embodiment, the controller 200 further comprises one or more of the following optional components for implementing feedback control: (1) a comparison unit 240 configured to determine a current error Δi representing a difference between a current i and a target current i* for a sampling time t, and (2) a feedback control unit 230 configured to generate, based on the current error Δi, one or more model loudspeaker parameter adjustments for correcting the feedforward control implemented by the feedback control unit 220. For example, in one embodiment, one or more loudspeaker parameters of the nonlinear model are adjusted based on the prediction error.

In another embodiment (e.g., the amplifier 60 is a current amplifier configured to amplify the source signal based on a target current i* received from the feedforward control unit 220), the controller 200 is configured to monitor a voltage u* driving the active speaker driver 55 at each sampling time t and determine a prediction error for correcting the feedforward control implemented by the feedback control unit 230 based on a comparison between the voltage u* and a control voltage ũ for the sampling time t. For example, in one embodiment, the comparison unit 240 is configured to determine a voltage error Δu representing a difference between a voltage u* and a control voltage ũ for the sampling time t, and the feedback control unit 230 is configured to generate, based on the voltage error Δu, one or more model loudspeaker parameters including a prediction error for correcting the feedforward control implemented by the feedback control unit 230.

Based on the model loudspeaker parameters generated, any resulting correction performed may compensate for one or more inaccuracies (e.g., manufacturing dispersion) associated with a physical model utilized by the controller 200 and/or audio drifting (e.g., resulting from overheating of the loudspeaker device due to excessive displacements).

In one embodiment, the feedback control implemented by the controller 200 may be adaptive (e.g., an online system identification). In another embodiment, the feedback control implemented by the controller 200 may be direct (e.g., Proportional-Integral-Derivative).

In another embodiment, if the active speaker driver 55 has well known and stable characteristics, the feedforward control unit 220 need not factor into account any prediction error, thereby removing the need for the feedback control unit 230 and the comparison unit 240.

Figure 5:
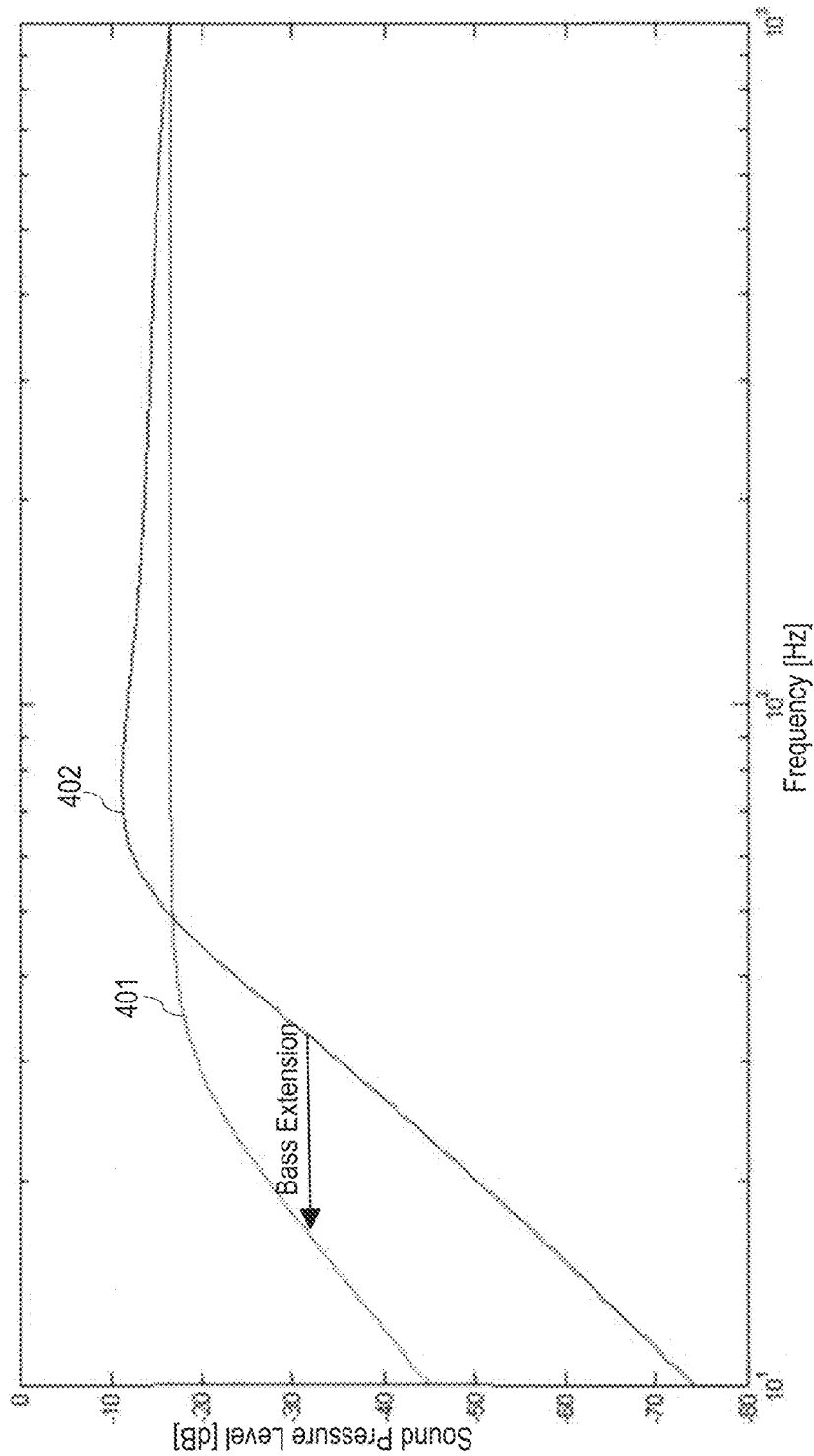
FIG. 5 is an example graph comparing frequency responses of a vented box loudspeaker system with nonlinear control and a different vented box loudspeaker system without nonlinear control, in accordance with an embodiment.

FIG. 5 is an example graph 400 comparing frequency responses of a vented box loudspeaker system with nonlinear control and a different vented box loudspeaker system without nonlinear control, in accordance with an embodiment. A horizontal axis of the graph 400 represents frequency in Hz. A vertical axis of the graph 400 represents sound pressure level in dB. The graph 400 comprises each of the following: (1) a first curve 401 representing frequency response of a first vented box loudspeaker system with nonlinear control (e.g., vented box loudspeaker system 70), and (2) a second curve 402 representing frequency response of a second vented box loudspeaker system without nonlinear control. As shown in FIG. 5, the frequency response of the second vented box loudspeaker system without nonlinear control has a steeper roll-off than the frequency response of the first vented box loudspeaker system with nonlinear control.

If the second vented box loudspeaker system is integrated with one or more components of the nonlinear control system 100 (e.g., controller 200), the nonlinear control system 100 can extend the roll-off of the frequency response of the second vented box loudspeaker system in the low sound frequencies while maintaining low audio distortion and ensuring that displacement of one or more moving components (e.g., diaphragm and/or driver voice coil) of the second vented box loudspeaker system is within a safe range of operation. The nonlinear control system 100 provides a bass reflex system that enables bass extension, as illustrated by the directional arrow shown in FIG. 5.

Figure 6A:
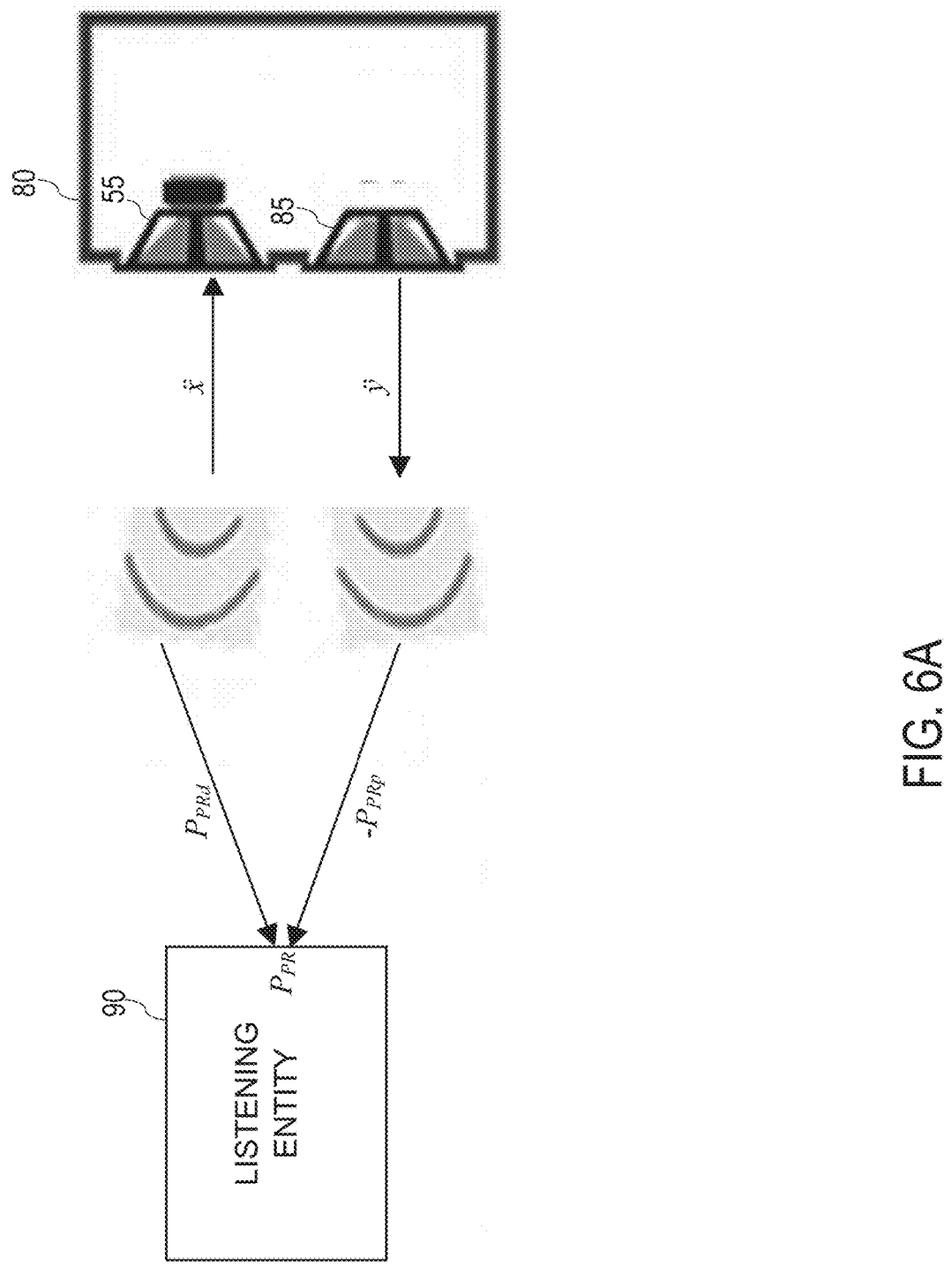
FIG. 6A illustrates sound pressure in a passive radiator loudspeaker system, in accordance with an embodiment.

FIG. 6A illustrates sound pressure in a passive radiator loudspeaker system 80, in accordance with an embodiment. As stated above, in one embodiment, the loudspeaker device 50 is a passive radiator loudspeaker system 80 comprising an active speaker driver 55 and a passive radiator 85. A passive radiator loudspeaker system 80 has increased efficiency at low sound frequencies, thereby allowing the passive radiator loudspeaker system 80 to attain significantly more bass output compared to a closed-box loudspeaker. Specifically, at low sound frequencies, the passive radiator 85 becomes a predominant sound source that complements one or more moving components (e.g., diaphragm 56 and/or driver voice coil 57) of the active speaker driver 55, resulting in a bass level boost that is limited through to a narrow sound frequency range. The passive radiator loudspeaker system 80 yields a similar bass response as the vented box loudspeaker system 70, but the passive radiator loudspeaker system 80 has fewer size restrictions, permitting use of smaller enclosures/boxes.

Let $P_{PRd}$ generally denote a sound pressure of the one or more moving components of the active speaker driver 55 of the passive radiator loudspeaker system 80, let $P_{PRp}$ generally denote a sound pressure in the passive radiator 85 of the passive radiator loudspeaker system 80, and let $P_{PR}$ generally denote a total sound pressure received at a listening entity 90 (e.g., a listener's ear, a microphone, etc.) that is within proximity of the passive radiator loudspeaker system 80. The sound pressure $P_{PRd}$, the sound pressure $P_{PRp}$, and the total sound pressure $P_{PR}$ may be determined in accordance with equations (15)-(17) provided below:

$$P_{PRd}=\rho S_a \ddot{x}/(2\pi r) \qquad (15),$$

$$P_{PRp}=\rho S_p \ddot{y}/(2\pi r) \qquad (16), \text{ and}$$

$$P_{PR}=P_{PRd}-P_{PRp} \qquad (17),$$

wherein ρ denotes the air density, ẍ denotes the acceleration of the active speaker moving component, r denotes a distance in m between the listening entity 90 and the passive radiator loudspeaker system 80, and ÿ denotes the acceleration of the passive speaker moving component. As shown in FIG. 6A, air from the passive radiator 85 moves outward when air from the one or more moving components moves inward. As such, the sound pressure $P_{PRp}$ is denoted as a negative value in FIG. 6A, and the sound pressure $P_{PRp}$ is subtracted from the sound pressure $P_{PRd}$ in equation (3).

In addition to electromechanical parameters for the active speaker driver 55, additional loudspeaker parameters for the passive radiator loudspeaker system 80 include, but are not limited to, the following: (1) an estimated (i.e., predicted) displacements of the passive radiator 85 (e.g., a membrane/diaphragm of the passive radiator 85), (2) a velocity w of the passive radiator 85, (3) a sound pressure p in the box 80, (4) an acoustic stiffness factor $K_{PRb}$ of air in the box 80, (5) a mechanical mass $M_p$ of the passive radiator 85, (6) a mechanical resistance $R_p$ of the passive radiator 85, (7) a suspension stiffness factor $K_p$ of the passive radiator 85, and (8) a surface area $S_p$ of the passive radiator.

Figure 6B:
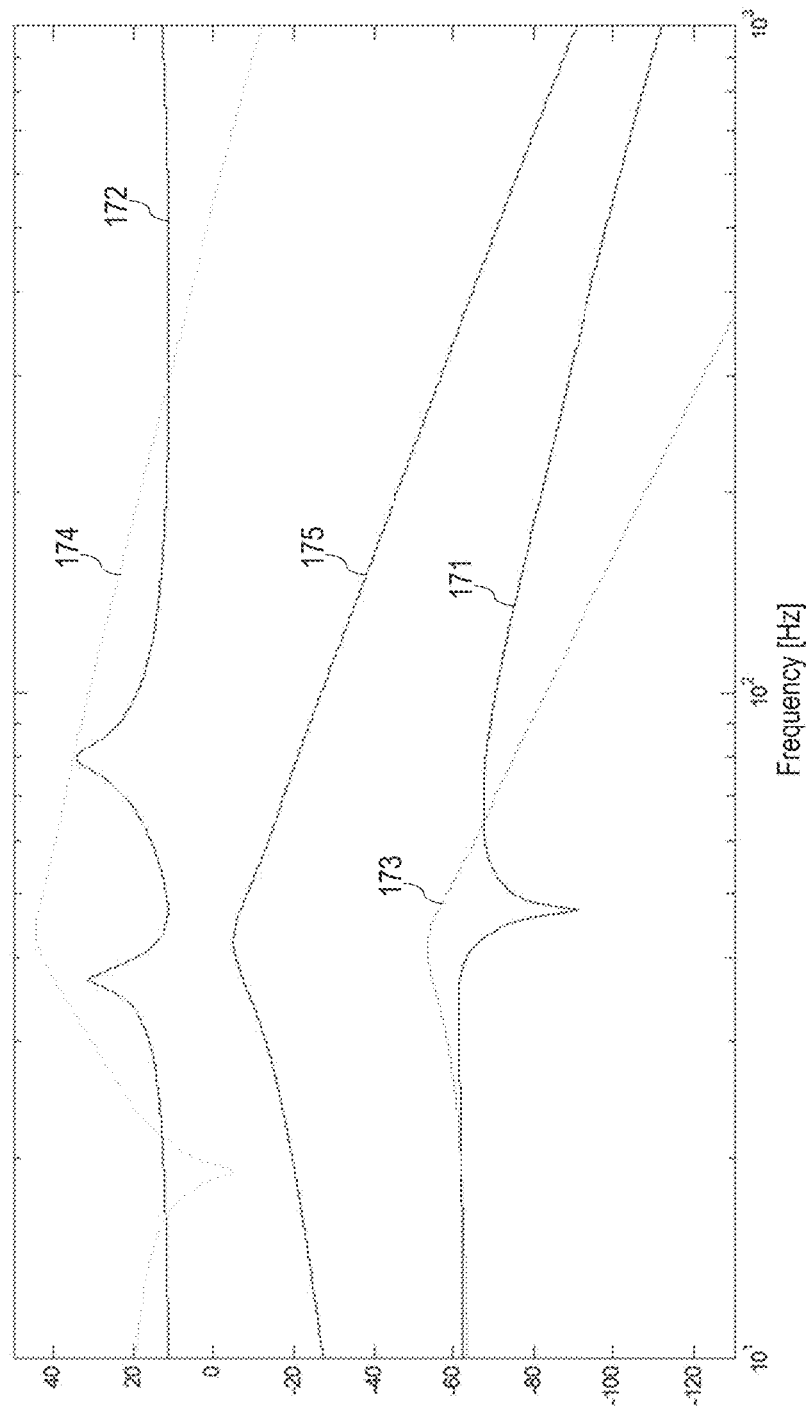
FIG. 6B is an example graph illustrating frequency responses of different loudspeaker parameters for a passive radiator loudspeaker system, in accordance with an embodiment.

FIG. 6B is an example graph 170 illustrating frequency responses of different loudspeaker parameters for a passive radiator loudspeaker system, in accordance with an embodiment. A horizontal axis of the graph 170 represents frequency in Hz. The graph 170 comprises each of the following: (1) a first curve 171 representing frequency response of estimated displacement x of one or more moving components (e.g., diaphragm and/or driver voice coil) of a passive radiator loudspeaker system (e.g., passive radiator loudspeaker system 80) in m/V, (2) a second curve 172 representing frequency response of impedance Z of a speaker driver of the passive radiator loudspeaker system in ohms, (3) a third curve 173 representing frequency response of estimated displacement y of a passive radiator of the passive radiator loudspeaker system in m/V, (4) a fourth curve 174 representing frequency response of sound pressure p in the box in Pa/V, and (5) a fifth curve 175 representing frequency response of velocity w of the passive radiator in m/s/V.

Figure 7:
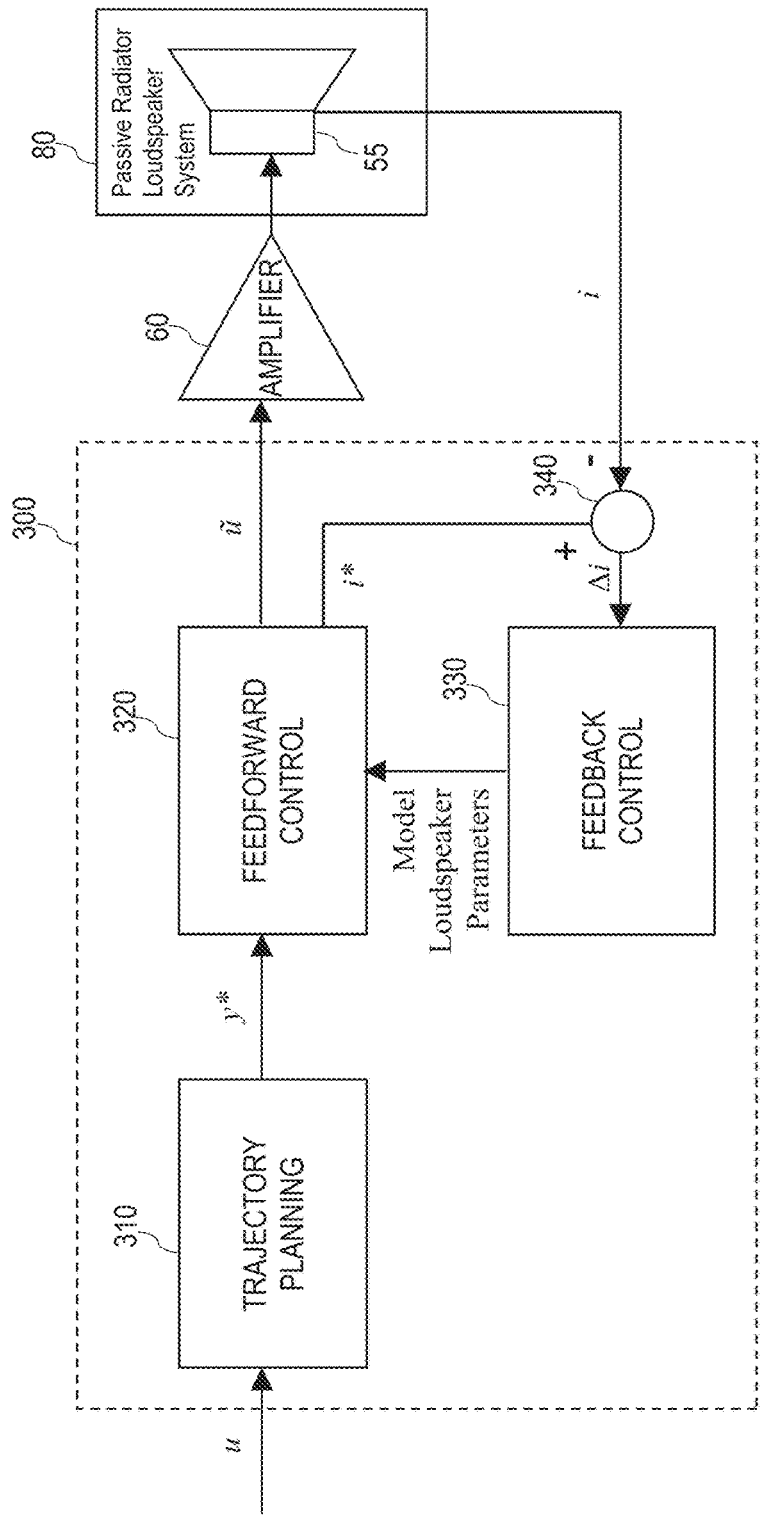
FIG. 7 illustrates an example controller for a passive radiator loudspeaker system, in accordance with an embodiment.

FIG. 7 illustrates an example controller 300 for the passive radiator loudspeaker system 80, in accordance with an embodiment. In one embodiment, the controller 110 of the nonlinear control system 100 is the controller 300. As described in detail later herein, the controller 300 comprises a trajectory planning unit 310 for determining one or more linear values, and a feedforward control unit 320 for determining one or more nonlinear values.

In one embodiment, the trajectory planning unit 310 is configured to linearize displacement of the passive radiator 85. Specifically, the trajectory planning unit 310 is configured to determine a target displacement y* of the passive radiator 85 (e.g., a membrane/diaphragm of the passive radiator 85) at each sampling time t based on an input voltage u received from an input source 10 and at least one physical model of the passive radiator loudspeaker system 80.

In one embodiment, the trajectory planning unit 310 utilizes a linear state-space model of the passive radiator loudspeaker system 80 to determine a target displacement y*. For example, in one embodiment, linear dynamics of the passive radiator loudspeaker system 80 may be represented in accordance with equations (18)-(21) provided below.

Let $X_{PR}(t)$ generally denote a vector representing a state ("state vector representation") of the passive radiator loudspeaker system 80 at a sampling time t, wherein the state vector representation $X_{PR}(t)$ is defined in accordance with equation (18) provided below:

$$X_{PR}(t)=[x,\dot{x},i,y,\dot{y},p]^T \qquad (18),$$

wherein p is the sound pressure in the passive radiator loudspeaker system 80. For expository purposes, the terms $X_{PR}(t)$ and $X_{PR}$ are used interchangeably in this specification.

Let $A_{PR}$ and $B_{PR}$ generally denote constant parameter matrices. In one embodiment, the constant parameter matrices $A_{PR}$ and $B_{PR}$ are represented in accordance with equations (19)-(20) provided below:

$$A_{PR} = \begin{bmatrix} 0 & 1 & 0 & 0 & 0 & 0 \\ -K_m/M_m & -R_m/M_m & Bl/M_m & 0 & 0 & -S_d/M_m \\ 0 & -Bl/L_e & -R_e L_e & 0 & 0 & 0 \\ 0 & 0 & 0 & 0 & 1 & 0 \\ 0 & 0 & 0 & -K_p/M_p & -R_p/M_p & S_p/M_p \\ 0 & K_b S_d & 0 & 0 & -K_b S_p & 0 \end{bmatrix}, \qquad (5)$$

and $$B_{PR} = \begin{bmatrix} 0 \\ 0 \\ 1/L_e \\ 0 \\ 0 \\ 0 \end{bmatrix}. \qquad (6)$$

Let $\dot{X}_{PR}$ generally denote a time derivative of the state vector representation $X_{PR}$ of the passive radiator loudspeaker system 80 ("state vector rate of change"), wherein the state vector rate of change $\dot{X}_{PR}$ is defined in accordance with a differential equation (21) provided below:

$$\dot{X}_{PR}=A_{PR}X_{PR}+B_{PR}u \qquad (21).$$

The trajectory planning unit 310 is configured to determine a target displacement y* for each sampling time t based on equation (21) as provided above.

In one embodiment, the feedforward control unit 320 is configured to: (1) determine, based on a target displacement y* for a sampling time t received from the trajectory planning unit 310 and at least one other physical model of the passive radiator loudspeaker system 80, a control voltage ũ that can produce the target displacement y*, and (2) determine, based on the target displacement y* and the at least one other physical model of the passive radiator loudspeaker system 80, a target current i* to draw through the active speaker driver 55 to produce the target displacement y*.

In one embodiment, the feedforward control unit 320 utilizes a nonlinear model of the passive radiator loudspeaker system 80 to determine a control voltage ũ and a target current i*. For example, in one embodiment, nonlinear dynamics for the passive radiator loudspeaker system 80 may be represented in accordance with equations (22)-(25) provided below:

$$M_m\ddot{x}+K_m(x)x+R_m\dot{x}+S_dp=Bl(x)i \quad (22),$$

wherein equation (22) is a mechanical equation for the active speaker driver 55, $$Bl(x)\dot{x}+R_e i+\partial\{L_e(x)i\}/\partial t=u \quad (23),$$

wherein equation (23) is an electrical equation for the active speaker driver 55, $$\ddot{y}=(-K_p(y)y-R_p\dot{y}+S_p p)M_p^{-1} \quad (24),$$

wherein equation (24) is an equation for the passive radiator 85, and $$\dot{p}=(S_d\dot{x}-S_p\dot{y})K_b \quad (25),$$

wherein equation (25) is an equation for sound pressure in the passive radiator loudspeaker system 80.

In one embodiment, the feedforward control unit 320 implements feedforward control to determine a control voltage ũ for each sampling time t. For example, in one embodiment, the feedforward control unit 320 performs a set of computations that include determining a sound pressure p for a sampling time t based on equation (26) as provided below:

$$p=(K_p(y)y+R_p\dot{y}+M_p\ddot{y})S_d^{-1} \quad (26),$$

wherein equation (26) is derived from equation (24) provided above, and a target displacement y* received from the trajectory planning unit 310 for the sampling time t is used as an input (i.e., input y in equation (26) is substituted with y* instead).

The set of computations performed by the feedforward control unit 320 further include determining an estimated displacement x of the one or more moving components (e.g., diaphragm 56 and/or driver voice coil 57) of the active speaker driver 55 for a sampling time t based on equation (27) as provided below:

$$x=(pK_b^{-1}+S_p y)S_d^{-1} \quad (27),$$

wherein equation (27) is derived from equation (25) provided above, and a sound pressure p (determined in accordance with equation (26) provided above) and an estimated displacement y of the passive radiator 85 for the sampling time t are used as inputs (y=y*).

The set of computations performed by the feedforward control unit 320 further include determining a current i drawn through the active speaker driver 55 for a sampling time t based on equation (28) provided below:

$$i=(M_m\ddot{x}+R_m\dot{x}+K_m(x)x+S_d p)Bl^{-1}(x) \quad (28),$$

wherein equation (28) is derived from equation (22) provided above, and a sound pressure p (determined in accordance with equation (26) provided above) and an estimated displacement x (determined in accordance with equation (27) provided above) for the sampling time t are used as inputs.

The set of computations performed by the feedforward control unit 320 further include determining a control voltage ũ for a sampling time t based on equation (29) provided below:

$$\tilde{u}=Bl(x)\dot{x}+Rei+\partial\{Le(x)i\}/\partial t \quad (29),$$

wherein equation (29) is derived from equation (23) provided above, and an estimated displacement x (determined in accordance with equation (27) provided above) and an amount of current i (determined in accordance with equation (28) provided above) for the sampling time t are used as inputs.

In one embodiment, the amplifier 60 is a voltage amplifier configured to amplify the source signal based on a control voltage ũ received from the feedforward control unit 320. In another embodiment, the amplifier 60 is a current amplifier configured to amplify the source signal based on a target current i* received from the feedforward control unit 320.

In one embodiment, the controller 300 is configured to monitor a current i drawn through the passive radiator loudspeaker system 80 at each sampling time t and determine a prediction error for correcting the feedforward control implemented by the feedback control unit 320 based on a comparison between the current i and a target current i* for the sampling time t. For example, in one embodiment, the controller 300 further comprises one or more of the following optional components for implementing feedback control: (1) a comparison unit 340 configured to determine a current error Δi representing a difference between a measured current i and a target current i* for a sampling time t, and (2) a feedback control unit 330 configured to generate, based on the current error Δi, one or more model loudspeaker parameters including a prediction error for correcting the feedforward control implemented by the feedback control unit 330. For example, in one embodiment, one or more loudspeaker parameters of the nonlinear model are adjusted based on the prediction error.

In another embodiment (e.g., the amplifier 60 is a current amplifier configured to amplify the source signal based on a target current i* received from the feedforward control unit 320), the controller 300 is configured to monitor a voltage u* driving the active speaker driver 55 at each sampling time t and determine a prediction error for correcting the feedforward control implemented by the feedback control unit 320 based on a comparison between the voltage u* and a control voltage ũ for the sampling time t. For example, in one embodiment, the comparison unit 340 is configured to determine a voltage error Δu representing a difference between a voltage u* and a control voltage ũ for the sampling time t, and the feedback control unit 330 is configured to generate, based on the voltage error Δu, one or more model loudspeaker parameters including a prediction error for correcting the feedforward control implemented by the feedback control unit 320.

Based on the model loudspeaker parameters generated, any resulting correction performed may compensate for one or more inaccuracies (e.g., manufacturing dispersion) associated with a physical model utilized by the controller 300 and/or audio drifting (e.g., resulting from overheating of the loudspeaker device due to excessive displacements).

In one embodiment, the feedback control implemented by the controller 300 may be adaptive (e.g., an online system identification). In another embodiment, the feedback control implemented by the controller 300 may be direct (e.g., Proportional-Integral-Derivative control).

In another embodiment, if the active speaker driver 55 has well known and stable characteristics, the feedforward control unit 320 need not factor into account any prediction error, thereby removing the need for the feedback control unit 330 and the comparison unit 340.

In another embodiment, instead of linearizing the passive radiator 85, the trajectory planning unit 310 is configured to linearize displacement of one or more moving components (e.g., diaphragm 56 and/or driver voice coil 57) of the active speaker driver 55. Specifically, the trajectory planning unit 310 is configured to determine a target displacement $x^*$ of the one or more moving components at each sampling time t based on an input voltage u received from an input source 10 and at least one physical model of the passive radiator loudspeaker system 80. Similarly, the feedforward control unit 320 is configured to determine, based on the target displacement $x^*$ for a sampling time t received from the trajectory planning unit 310 and at least one other physical model of the passive radiator loudspeaker system 80, a control voltage $\tilde{u}$ and a target current $i^*$ that can produce the target displacement $x^*$.

Figure 8:
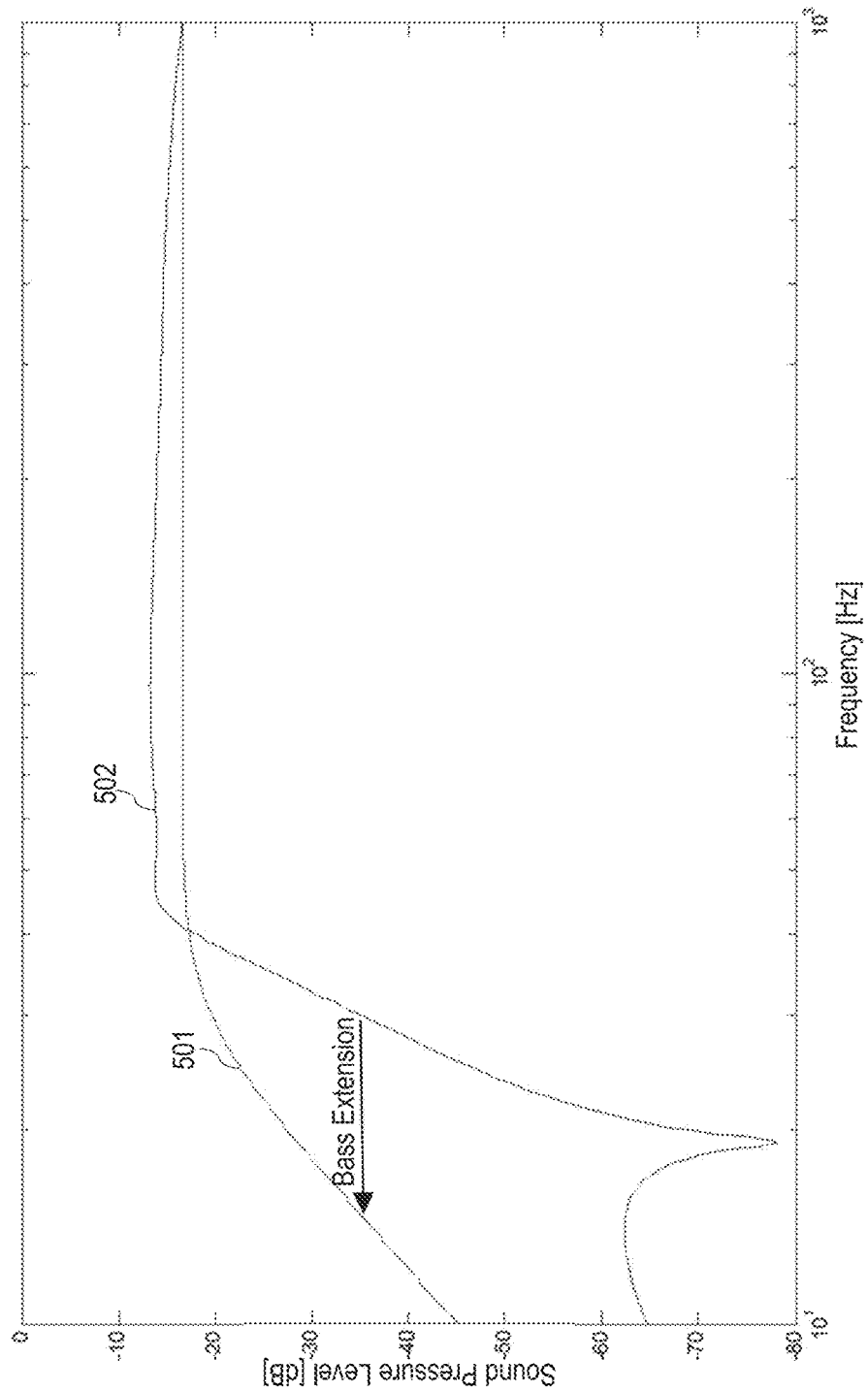
FIG. 8 is an example graph comparing frequency responses of a passive radiator loudspeaker system with nonlinear control and a different passive radiator loudspeaker system without nonlinear control, in accordance with an embodiment.

FIG. 8 is an example graph 500 comparing frequency responses of a passive radiator loudspeaker system with nonlinear control and a different passive radiator loudspeaker system without nonlinear control, in accordance with an embodiment. A horizontal axis of the graph 500 represents frequency in Hz. A vertical axis of the graph 500 represents sound pressure level in decibels (dB). The graph 500 comprises each of the following: (1) a first curve 501 representing frequency response of a first passive radiator loudspeaker system with nonlinear control (e.g., passive radiator loudspeaker system 80), and (2) a second curve 502 representing frequency response of a second passive radiator system without nonlinear control. As shown in FIG. 8, the frequency response of the second passive radiator loudspeaker system without nonlinear control has a steeper roll-off than the frequency response of the first passive radiator loudspeaker system with nonlinear control.

If the second passive radiator loudspeaker system is integrated with one or more components of the nonlinear control system 100 (e.g., controller 300), the nonlinear control system 100 can extend the roll-off of the frequency response of the second passive radiator loudspeaker system in the low sound frequencies while maintaining low audio distortion and ensuring that displacement of one or more moving components (e.g., diaphragm and/or driver voice coil) of the second passive radiator loudspeaker system is within a safe range of operation. The nonlinear control system 100 provides a bass reflex system that enables bass extension, as illustrated by the directional arrow shown in FIG. 8.

Figure 9:
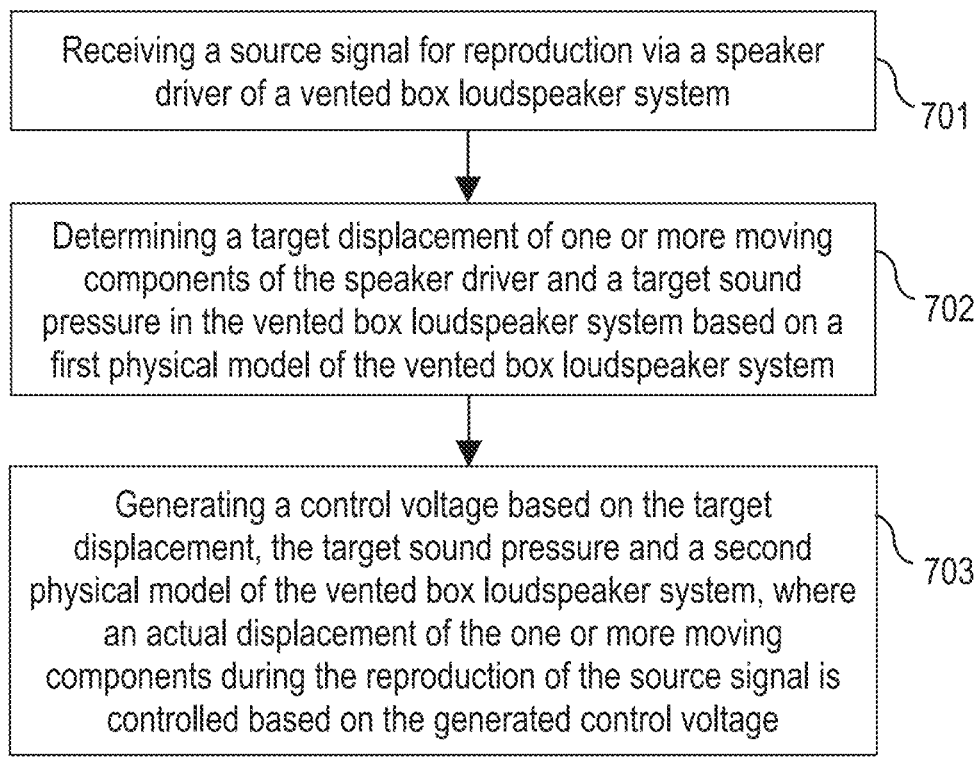
FIG. 9 is an example flowchart of a process for implementing a nonlinear control system for a vented box loudspeaker system, in accordance with an embodiment.

FIG. 9 is an example flowchart of a process 700 for implementing a nonlinear control system for a vented box loudspeaker system, in accordance with an embodiment. Process block 701 includes receiving a source signal for reproduction via a speaker driver (e.g., active speaker driver 55) of a vented box loudspeaker system (e.g., vented box loudspeaker system 70). Process block 702 includes determining a target displacement of one or more moving components (e.g., diaphragm 56 and/or driver voice coil 57) of the speaker driver and a target sound pressure in the vented box loudspeaker system based on a first physical model of the vented box loudspeaker system. Process block 703 includes generating a control voltage based on the target displacement, the target sound pressure, and a second physical model of the vented box loudspeaker system, where an actual displacement of the one or more moving components during the reproduction of the source signal is controlled based on the control voltage.

In one embodiment, one or more components of the nonlinear control system 100, such as the controller 200, are configured to perform process blocks 701-703.

Figure 10:
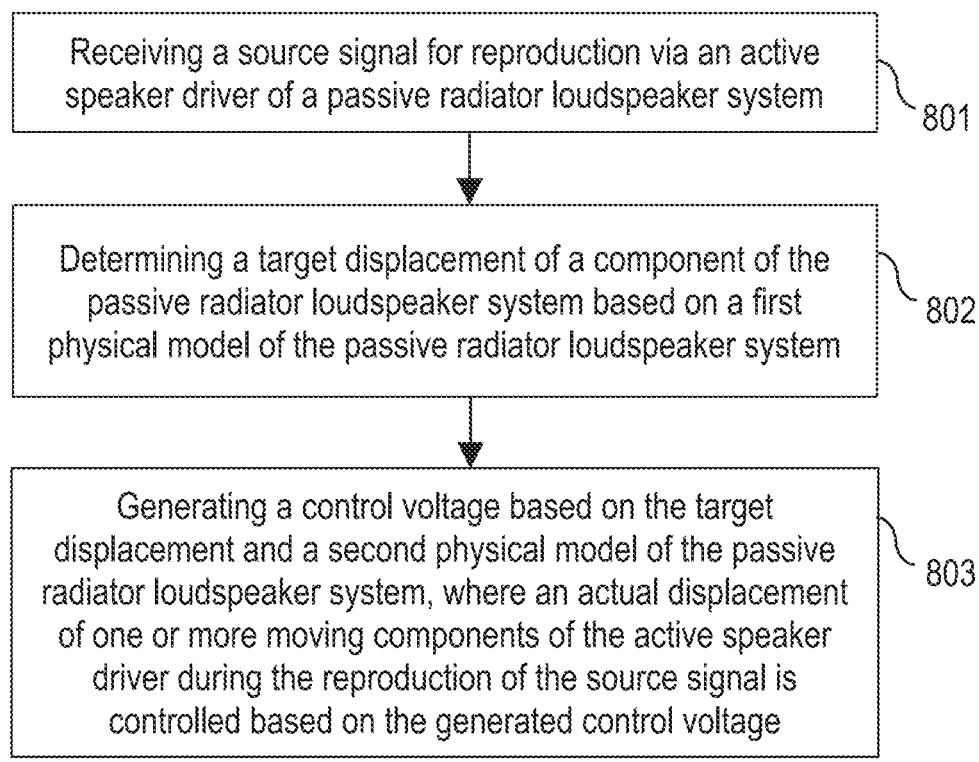
FIG. 10 is an example flowchart of a process for implementing a nonlinear control system for a passive radiator loudspeaker system, in accordance with an embodiment.

FIG. 10 is an example flowchart of a process 800 for implementing a nonlinear control system for a passive radiator loudspeaker system, in accordance with an embodiment. Process block 801 includes receiving a source signal for reproduction via a speaker driver (e.g., active speaker driver 55) of a passive radiator loudspeaker system (e.g., passive radiator loudspeaker system 80). Process block 802 includes determining a target displacement of a component (e.g., passive radiator 85, or one or more moving components of active speaker driver 55, such as diaphragm 56 and/or driver voice coil 57) of the passive radiator loudspeaker system based on a first physical model of the passive radiator loudspeaker system. Process block 803 includes generating a control voltage based on the target displacement and a second physical model of the passive radiator loudspeaker system, where an actual displacement of one or more moving components (e.g., diaphragm 56 and/or driver voice coil 57) of the active speaker driver during the reproduction of the source signal is controlled based on the control voltage.

In one embodiment, one or more components of the nonlinear control system 100, such as the controller 300, are configured to perform process blocks 801-803.

Figure 11:
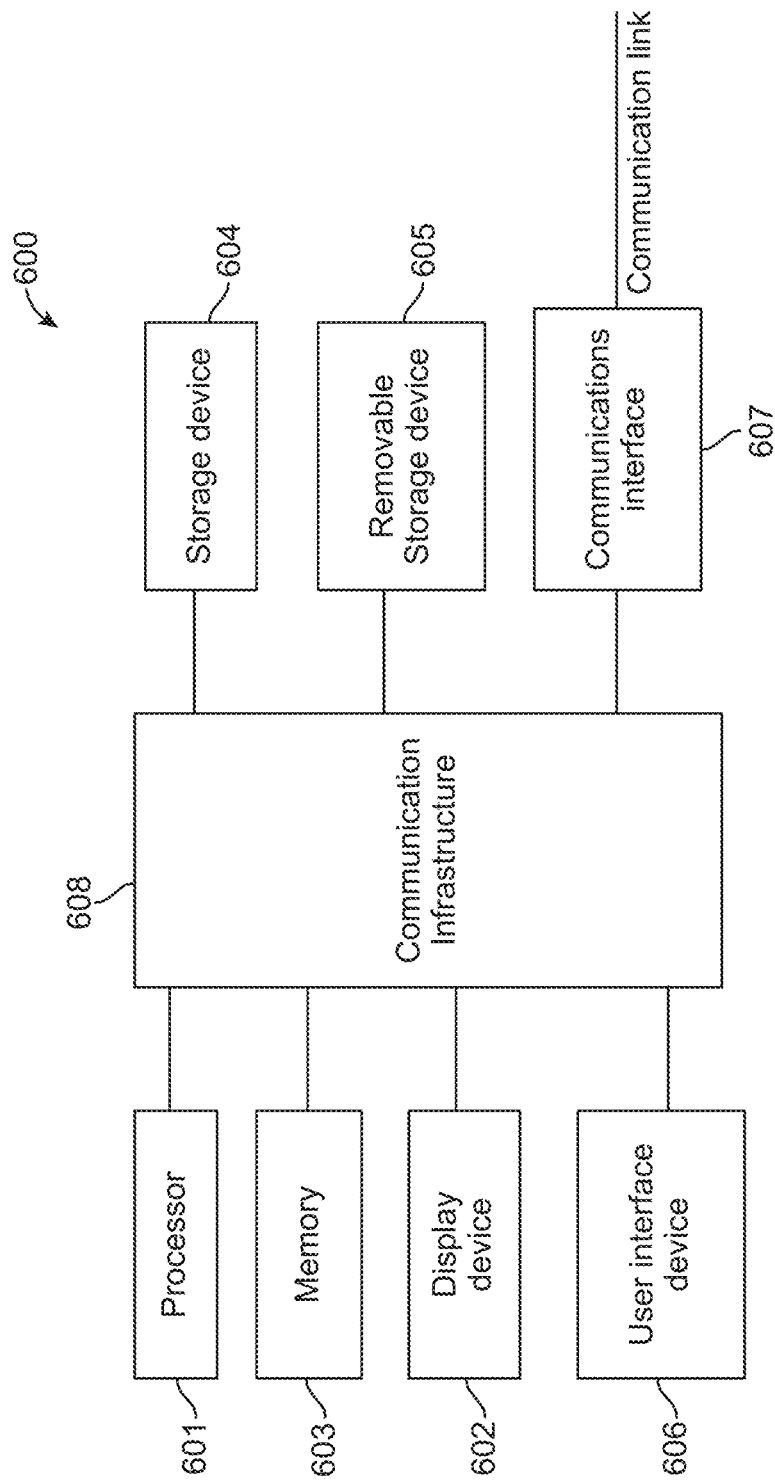
FIG. 11 is a high-level block diagram showing an information processing system comprising a computer system useful for implementing various disclosed embodiments.

FIG. 11 is a high-level block diagram showing an information processing system comprising a computer system 600 useful for implementing various disclosed embodiments. The computer system 600 includes one or more processors 601, and can further include an electronic display device 602 (for displaying video, graphics, text, and other data), a main memory 603 (e.g., random access memory (RAM)), storage device 604 (e.g., hard disk drive), removable storage device 605 (e.g., removable storage drive, removable memory module, a magnetic tape drive, optical disk drive, computer readable medium having stored therein computer software and/or data), user interface device 606 (e.g., keyboard, touch screen, keypad, pointing device), and a communication interface 607 (e.g., modem, a network interface (such as an Ethernet card), a communications port, or a PCMCIA slot and card).

The communication interface 607 allows software and data to be transferred between the computer system 600 and external devices. The nonlinear controller 600 further includes a communications infrastructure 608 (e.g., a communications bus, cross-over bar, or network) to which the aforementioned devices/modules 601 through 607 are connected.

Information transferred via the communications interface 607 may be in the form of signals such as electronic, electromagnetic, optical, or other signals capable of being received by communications interface 607, via a communication link that carries signals and may be implemented using wire or cable, fiber optics, a phone line, a cellular phone link, a radio frequency (RF) link, and/or other communication channels. Computer program instructions representing the block diagrams and/or flowcharts herein may be loaded onto a computer, programmable data processing apparatus, or processing devices to cause a series of operations performed thereon to produce a computer implemented process. In one embodiment, processing instructions for process 700 (FIG. 9) and process 800 (FIG. 10) may be stored as program instructions on the memory 603, storage device 604, and/or the removable storage device 605 for execution by the processor 601.

Embodiments have been described with reference to flowchart illustrations and/or block diagrams of methods, apparatus (systems), and computer program products. In some cases, each block of such illustrations/diagrams, or combinations thereof, can be implemented by computer program instructions. The computer program instructions when provided to a processor produce a machine, such that the instructions, which executed via the processor create means for implementing the functions/operations specified in the flowchart and/or block diagram. Each block in the flowchart/block diagrams may represent a hardware and/or software module or logic. In alternative implementations, the functions noted in the blocks may occur out of the order noted in the figures, concurrently, etc.

The terms "computer program medium," "computer usable medium," "computer readable medium," and "computer program product," are used to generally refer to media such as main memory, secondary memory, removable storage drive, a hard disk installed in hard disk drive, and signals. These computer program products are means for providing software to the computer system. The computer readable medium allows the computer system to read data, instructions, messages or message packets, and other computer readable information from the computer readable medium. The computer readable medium, for example, may include non-volatile memory, such as a floppy disk, ROM, flash memory, disk drive memory, a CD-ROM, and other permanent storage. It is useful, for example, for transporting information, such as data and computer instructions, between computer systems. Computer program instructions may be stored in a computer readable medium that can direct a computer, other programmable data processing apparatuses, or other devices to function in a particular manner, such that the instructions stored in the computer readable medium produce an article of manufacture including instructions which implement the function/act specified in the flowchart and/or block diagram block(s).

As will be appreciated by one skilled in the art, aspects of the embodiments may be embodied as a system, method or computer program product. Accordingly, aspects of the embodiments may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the embodiments may take the form of a computer program product embodied in one or more computer readable medium(s) having computer readable program code embodied thereon.

Any combination of one or more computer readable medium(s) may be utilized. The computer readable medium may be a computer readable storage medium (e.g., a non-transitory computer readable storage medium). A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Computer program code for carrying out operations for aspects of one or more embodiments may be written in any combination of one or more programming languages, including an object oriented programming language such as Java, Smalltalk, C++, or the like, and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

In some cases, aspects of one or more embodiments are described above with reference to flowchart illustrations and/or block diagrams of methods, apparatuses (systems), and computer program products. In some instances, it will be understood that each block of the flowchart illustrations and/or block diagrams, and combinations of blocks in the flowchart illustrations and/or block diagrams, can be implemented by computer program instructions. These computer program instructions may be provided to a special purpose computer, or other programmable data processing apparatus to produce a machine, such that the instructions, which execute via the processor of the computer or other programmable data processing apparatus, create means for implementing the functions/acts specified in the flowchart and/or block diagram block(s).

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block(s).

The computer program instructions may also be loaded onto a computer, other programmable data processing apparatuses, or other devices to cause a series of operational steps to be performed on the computer, other programmable apparatuses, or other devices to produce a computer implemented process such that the instructions which execute on the computer or other programmable apparatuses provide processes for implementing the functions/acts specified in the flowchart and/or block diagram block(s).

The flowchart and block diagrams in the Figures illustrate the architecture, functionality, and operation of possible implementations of systems, methods, and computer program products according to various embodiments. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

References in the claims to an element in the singular is not intended to mean "one and only" unless explicitly so stated, but rather "one or more." All structural and functional equivalents to the elements of the above-described exemplary embodiment that are currently known or later come to be known to those of ordinary skill in the art are intended to be encompassed by the present claims. No claim element herein is to be construed under the provisions of pre-AIA 35 U.S.C. section 112, sixth paragraph, unless the element is expressly recited using the phrase "means for" or "step for."

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the embodiments has been presented for purposes of illustration and description, but is not intended to be exhaustive or limited to the embodiments in the form disclosed. Many modifications and variations will be apparent to those of ordinary skill in the art without departing from the scope and spirit of the invention.

Though the embodiments have been described with reference to certain versions thereof; however, other versions are possible. Therefore, the spirit and scope of the appended claims should not be limited to the description of the preferred versions contained herein.

What is claimed is:

1. A vented box loudspeaker system comprising:
   a speaker driver including a diaphragm; and
   a controller configured to:
      receive a source signal for reproduction via the speaker driver;
      determine a target displacement of the diaphragm and a target sound pressure in the vented box loudspeaker system based on a first physical model of the vented box loudspeaker system; and
      generate a control voltage based on the target displacement, the target sound pressure, and a second physical model of the vented box loudspeaker system;
      wherein an actual displacement of the diaphragm during the reproduction of the source signal is controlled based on the generated control voltage.

2. The vented box loudspeaker system of claim 1, wherein the controller is further configured to:
   determine a target current to draw through the speaker driver based on the target displacement, the target sound pressure, and the second physical model;
   monitor an actual current drawn through the speaker driver during the reproduction of the source signal; and
   generate a prediction error based on a comparison of the target current and the actual current.

3. The vented box loudspeaker system of claim 2, wherein the controller is further configured to:
   compensate for one or more inaccuracies associated with the second physical model or audio drifting by adjusting one or more loudspeaker parameters of the second physical model based on the prediction error.

4. The vented box loudspeaker system of claim 1, wherein the generated control voltage limits the actual displacement of the diaphragm within a predetermined range of safe displacement and increases bass output at low frequencies.

5. The vented box loudspeaker system of claim 1, wherein the first physical model is a linear state-space model.

6. The vented box loudspeaker system of claim 1, wherein the second physical model is a nonlinear model.

7. The vented box loudspeaker system of claim 1, further comprising:
   an amplifier coupled to the speaker driver and the controller, the amplifier configured to amplify the source signal based on the generated control voltage.

8. A passive radiator loudspeaker system comprising:
   an active speaker driver including a diaphragm; and
   a controller configured to:
      receive a source signal for reproduction via the active speaker driver;
      determine a target displacement of a component of the passive radiator loudspeaker system based on a first physical model of the passive radiator loudspeaker system; and
      generate a control voltage based on the target displacement and a second physical model of the passive radiator loudspeaker system;
      wherein an actual displacement of the diaphragm of the active speaker driver during the reproduction of the source signal is controlled based on the generated control voltage.

9. The passive radiator loudspeaker system of claim 8, wherein the passive radiator loudspeaker system further comprises a passive radiator, and the target displacement is a target displacement of the passive radiator.

10. The passive radiator loudspeaker system of claim 8, wherein the target displacement is a target displacement of the diaphragm of the active speaker driver.

11. The passive radiator loudspeaker system of claim 8, wherein the controller is further configured to:
   determine a target current to draw through the active speaker driver based on the target displacement and the second physical model;
   monitor an actual current drawn through the active speaker driver during the reproduction of the source signal; and
   generate a prediction error based on a comparison of the target current and the actual current.

12. The passive radiator loudspeaker system of claim 11, wherein the controller is further configured to:
   compensate for one or more inaccuracies associated with the second physical model or audio drifting by adjusting one or more loudspeaker parameters of the second physical model based on the prediction error.

13. The passive radiator loudspeaker system of claim 8, wherein the generated control voltage limits the actual displacement of the diaphragm within a predetermined range of safe displacement and increases bass output at low frequencies.

14. The passive radiator loudspeaker system of claim 8, wherein the first physical model is a linear state-space model.

15. The passive radiator loudspeaker system of claim 8, wherein the second physical model is a nonlinear model.

16. The passive radiator loudspeaker system of claim 8, further comprising:
   an amplifier coupled to the active speaker driver and the controller, the amplifier configured to amplify the source signal based on the generated control voltage.

17. A method comprising:
   receiving a source signal for reproduction via a speaker driver of a loudspeaker device;
   determining a target displacement of a component of the loudspeaker device based on a first physical model of the loudspeaker device; and
   generating a control voltage based on the target displacement and a second physical model of the loudspeaker device;
   wherein an actual displacement of a diaphragm of the speaker driver during the reproduction of the source signal is controlled based on the generated control voltage.

18. The method of claim 17, wherein the loudspeaker device is a vented box loudspeaker system, and the target displacement is a target displacement of the diaphragm of the speaker driver.

19. The method of claim 18, further comprising:
   determining a target sound pressure in the vented box loudspeaker system based on the first physical model, wherein the generated control voltage is further based on the target sound pressure.

20. The method of claim 17, wherein the loudspeaker device is a passive radiator loudspeaker system including a passive radiator, and the target displacement is one of a target displacement of the diaphragm of the speaker driver or a target displacement of the passive radiator.

* * * * *